United States Patent
Kim et al.

(10) Patent No.: US 11,302,708 B2
(45) Date of Patent: Apr. 12, 2022

(54) MEMORY ARRAYS, AND METHODS OF FORMING MEMORY ARRAYS

(71) Applicant: Micron Technology, Inc., Boise, ID (US)

(72) Inventors: Changhan Kim, Boise, ID (US); Chet E. Carter, Boise, ID (US); Cole Smith, Boise, ID (US); Collin Howder, Meridian, ID (US); Richard J. Hill, Boise, ID (US); Jie Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 144 days.

(21) Appl. No.: 16/674,823

(22) Filed: Nov. 5, 2019

(65) Prior Publication Data

US 2020/0075630 A1   Mar. 5, 2020

Related U.S. Application Data

(62) Division of application No. 15/948,639, filed on Apr. 9, 2018, now Pat. No. 10,497,715.

(Continued)

(51) Int. Cl.
*H01L 27/11582* (2017.01)
*H01L 23/528* (2006.01)
(Continued)

(52) U.S. Cl.
CPC .... *H01L 27/11582* (2013.01); *H01L 21/0214* (2013.01); *H01L 21/0217* (2013.01);
(Continued)

(58) Field of Classification Search
CPC ......... H01L 27/11551; H01L 27/11553; H01L 27/11556; H01L 27/11578; H01L 27/1158; H01L 27/11582
See application file for complete search history.

(56) References Cited

U.S. PATENT DOCUMENTS

| 7,427,443 B2 | 9/2008 | Uchimaru et al. |
| 9,093,547 B2 | 7/2015 | Lee |

(Continued)

FOREIGN PATENT DOCUMENTS

| JP | 2005-85962 | 3/2005 |
| JP | 2017-103328 | 6/2017 |

(Continued)

OTHER PUBLICATIONS

WO PCT/US2018/063590 Search Rept., Published Mar. 29, 2019, Micron Technology, Inc.

(Continued)

*Primary Examiner* — Bryan R Junge
(74) *Attorney, Agent, or Firm* — Wells St. John P.S.

(57) ABSTRACT

Some embodiments include a method of forming an assembly (e.g., a memory array). A first opening is formed through a stack of alternating first and second levels. The first levels contain silicon nitride, and the second levels contain silicon dioxide. Some of the silicon dioxide of the second levels is replaced with memory cell structures. The memory cell structures include charge-storage regions adjacent charge-blocking regions. Tunneling material is formed within the first opening, and channel material is formed adjacent the tunneling material. A second opening is formed through the stack. The second opening extends through remaining portions of the silicon dioxide, and through the silicon nitride. The remaining portions of the silicon dioxide are removed to form cavities. Conductive regions are formed within the cavities. The silicon nitride is removed to form voids between the conductive regions. Some embodiments include memory arrays.

23 Claims, 28 Drawing Sheets

Related U.S. Application Data

(60) Provisional application No. 62/610,657, filed on Dec. 27, 2017.

(51) Int. Cl.

| | | |
|---|---|---|
| *H01L 27/11568* | (2017.01) | |
| *H01L 29/51* | (2006.01) | |
| *H01L 29/49* | (2006.01) | |
| *H01L 21/311* | (2006.01) | |
| *H01L 21/02* | (2006.01) | |
| *H01L 27/11521* | (2017.01) | |
| *H01L 27/11556* | (2017.01) | |
| *H01L 29/788* | (2006.01) | |
| *H01L 29/792* | (2006.01) | |
| *H01L 29/66* | (2006.01) | |
| *H01L 29/10* | (2006.01) | |
| *H01L 21/28* | (2006.01) | |
| *H01L 27/11529* | (2017.01) | |
| *H01L 27/1157* | (2017.01) | |

(52) U.S. Cl.
CPC .... *H01L 21/0223* (2013.01); *H01L 21/02164* (2013.01); *H01L 21/02636* (2013.01); *H01L 21/31111* (2013.01); *H01L 23/528* (2013.01); *H01L 27/1157* (2013.01); *H01L 27/11521* (2013.01); *H01L 27/11529* (2013.01); *H01L 27/11556* (2013.01); *H01L 27/11568* (2013.01); *H01L 29/1037* (2013.01); *H01L 29/40114* (2019.08); *H01L 29/40117* (2019.08); *H01L 29/4991* (2013.01); *H01L 29/513* (2013.01); *H01L 29/518* (2013.01); *H01L 29/66825* (2013.01); *H01L 29/66833* (2013.01); *H01L 29/7883* (2013.01); *H01L 29/7889* (2013.01); *H01L 29/7926* (2013.01); *H01L 21/02255* (2013.01)

(56) References Cited

U.S. PATENT DOCUMENTS

| 9,653,475 | B1* | 5/2017 | Yoshimizu | .......... H01L 29/0649 |
|---|---|---|---|---|
| 9,728,552 | B1 | 8/2017 | Fukumoto | |
| 10,083,981 | B2 | 9/2018 | Daycock | |
| 10,128,265 | B2 | 11/2018 | Carlson | |
| 10,164,009 | B1 | 12/2018 | Carlson | |
| 10,700,087 | B2* | 6/2020 | Han | .......... H01L 27/1157 |
| 2006/0151821 | A1 | 7/2006 | Melik-Martirosian | |
| 2009/0283819 | A1 | 11/2009 | Ishikawa et al. | |
| 2009/0321813 | A1 | 12/2009 | Kidoh et al. | |
| 2010/0163968 | A1* | 7/2010 | Kim | .......... H01L 27/11565 257/324 |
| 2010/0314678 | A1* | 12/2010 | Lim | .......... H01L 27/11582 257/324 |
| 2011/0233645 | A1 | 9/2011 | Iinuma | |
| 2012/0012920 | A1 | 1/2012 | Shin et al. | |
| 2014/0220750 | A1* | 8/2014 | Sohn | .......... H01L 29/7926 438/269 |
| 2015/0132915 | A1 | 5/2015 | Park | |
| 2015/0380431 | A1 | 12/2015 | Kanamori | |
| 2016/0043093 | A1* | 2/2016 | Lee | .......... H01L 29/40114 257/314 |
| 2016/0064532 | A1 | 3/2016 | Makala | |
| 2016/0071871 | A1* | 3/2016 | Kamigaichi | ........ H01L 29/7926 257/314 |
| 2016/0118398 | A1 | 4/2016 | Yon et al. | |
| 2016/0163725 | A1 | 6/2016 | Kamiya et al. | |
| 2016/0172370 | A1 | 6/2016 | Makala et al. | |
| 2017/0084626 | A1 | 3/2017 | Kim et al. | |
| 2017/0162593 | A1 | 6/2017 | Shimura | |
| 2017/0229474 | A1 | 8/2017 | Shimizu | |
| 2017/0243879 | A1* | 8/2017 | Yu | .......... H01L 27/1157 |
| 2017/0263613 | A1 | 9/2017 | Murakoshi et al. | |
| 2017/0271527 | A1 | 9/2017 | Higuchi et al. | |
| 2018/0277554 | A1* | 9/2018 | Kaneko | .......... H01L 27/1157 |

FOREIGN PATENT DOCUMENTS

| JP | 2017-163044 | 9/2017 |
|---|---|---|
| JP | 2007-9048 | 1/2018 |
| WO | WO PCT/US2018/063590 | 6/2020 |
| WO | WO PCT/US2018/063978 | 6/2020 |
| WO | WO PCT/US2020/064401 | 6/2020 |

OTHER PUBLICATIONS

WO PCT/US2018/063590 Writ. Opin., Published Mar. 29, 2019, Micron Technology, Inc.
WO PCT/US2018/063978 Search Rept., Published Apr. 1, 2019, Micron Technology, Inc.
WO PCT/US2018/063978 Writ. Opin., Published Apr. 1, 2019, Micron Technology, Inc.
WO PCT/US2018/064401 Search Rept., Published Apr. 8, 2019, Micron Technology, Inc.
WO PCT/US2018/064401 Writ. Opin., Published Apr. 8, 2019, Micron Technology, Inc.
EP EP 18897499 Supp. SR, Published Dec. 23, 2020, Micron Technology, Inc.

* cited by examiner

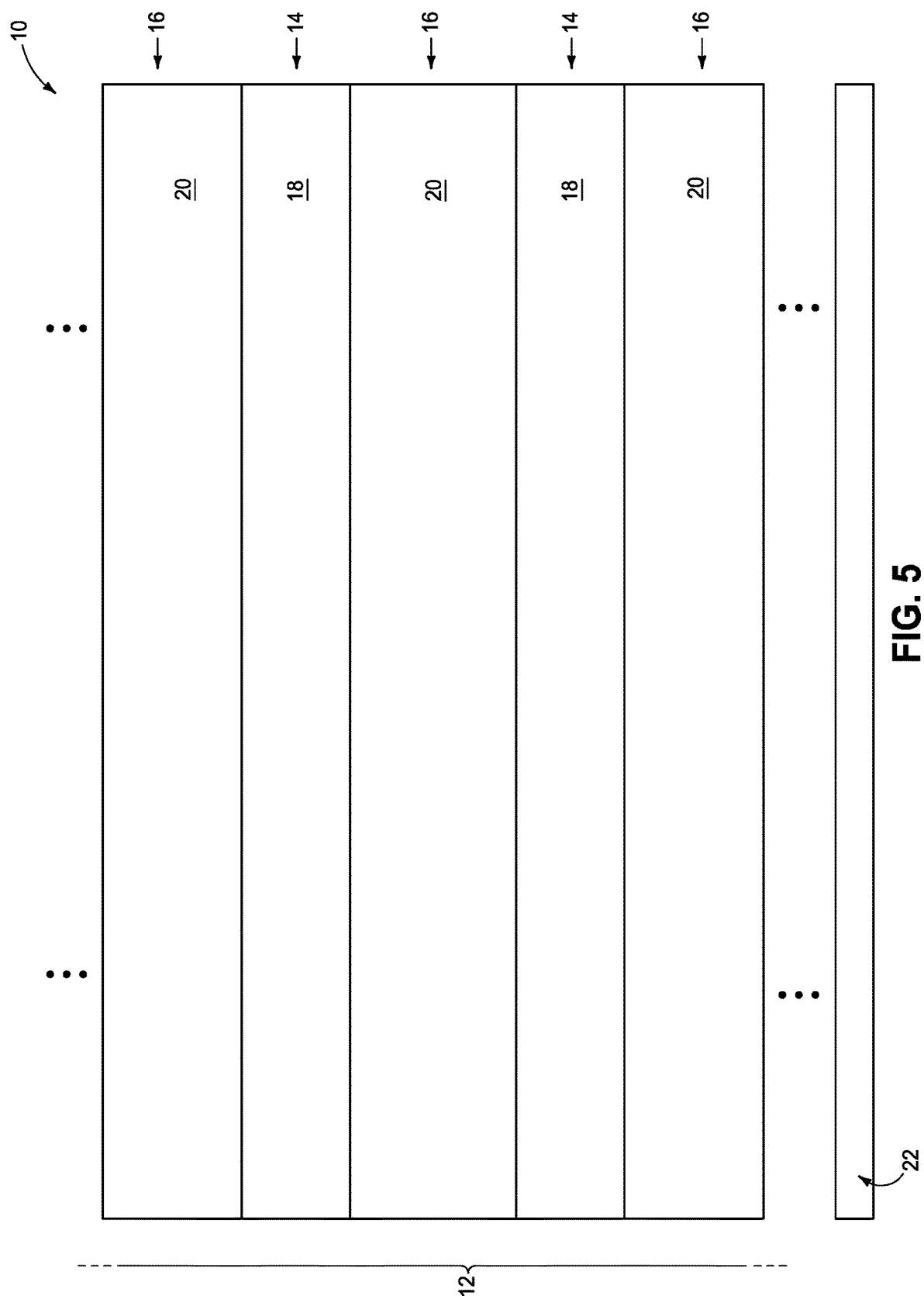

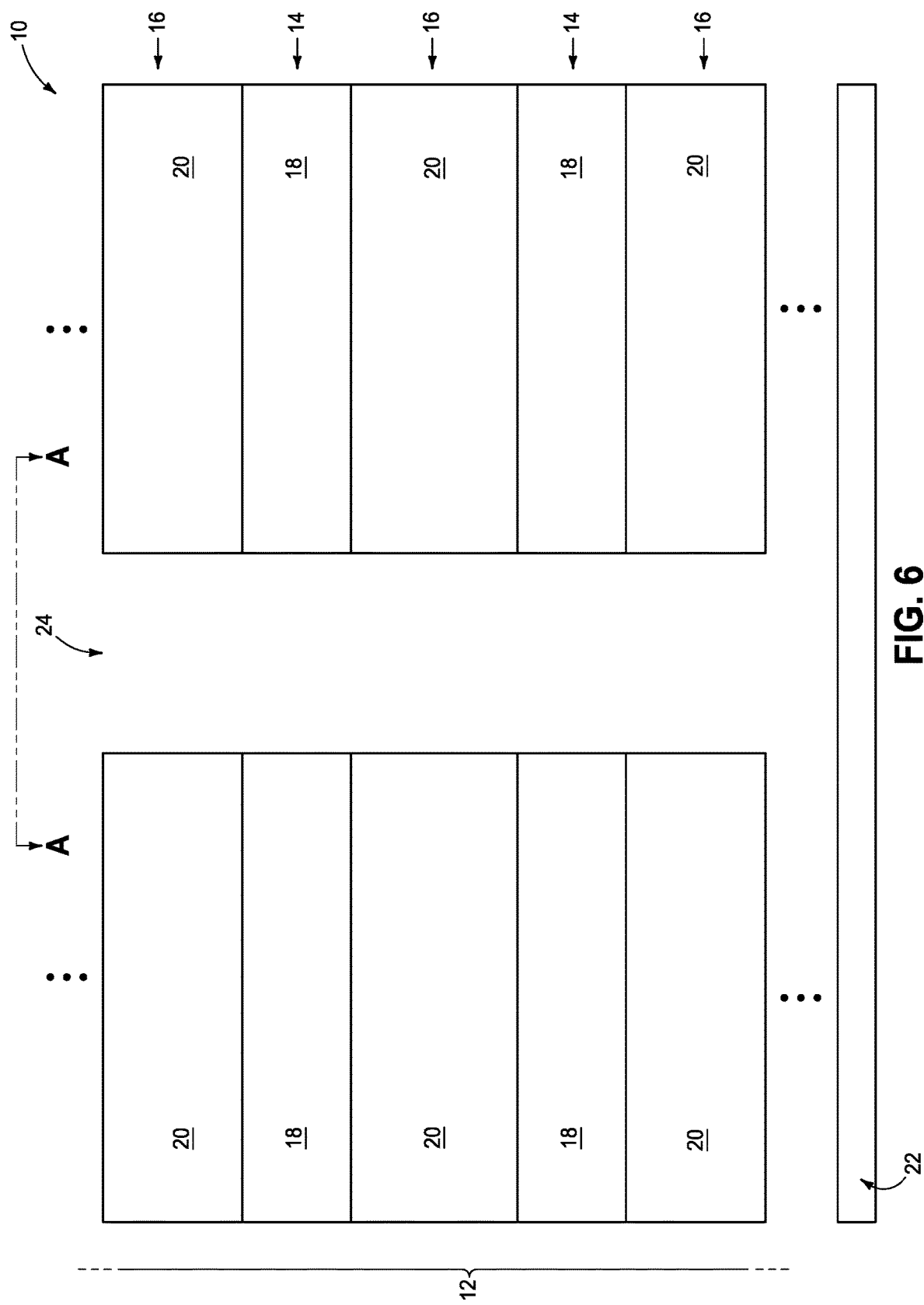

MEMORY ARRAYS, AND METHODS OF FORMING MEMORY ARRAYS

RELATED PATENT DATA

This patent resulted from a divisional of U.S. patent application Ser. No. 15/948,639 filed Apr. 9, 2018, which claims priority to U.S. Provisional application Ser. No. 62/610,657, which was filed Dec. 27, 2017, each of which is hereby incorporated by reference herein.

TECHNICAL FIELD

Memory arrays (e.g., NAND memory arrays), and methods of forming memory arrays.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 100 which includes a memory array 102 having a plurality of memory cells 103 arranged in rows and columns along with access lines 104 (e.g., wordlines to conduct signals WL0 through WLm) and first data lines 106 (e.g., bitlines to conduct signals BL0 through BLn). Access lines 104 and first data lines 106 may be used to transfer information to and from the memory cells 103. A row decoder 107 and a column decoder 108 decode address signals A0 through AX on address lines 109 to determine which ones of the memory cells 103 are to be accessed. A sense amplifier circuit 115 operates to determine the values of information read from the memory cells 103. An I/O circuit 117 transfers values of information between the memory array 102 and input/output (I/O) lines 105. Signals DQ0 through DQN on the I/O lines 105 can represent values of information read from or to be written into the memory cells 103. Other devices can communicate with the device 100 through the I/O lines 105, the address lines 109, or the control lines 120. A memory control unit 118 is used to control memory operations to be performed on the memory cells 103, and utilizes signals on the control lines 120. The device 100 can receive supply voltage signals Vcc and Vss on a first supply line 130 and a second supply line 132, respectively. The device 100 includes a select circuit 140 and an input/output (I/O) circuit 117. The select circuit 140 can respond, via the I/O circuit 117, to signals CSEL1 through CSELn to select signals on the first data lines 106 and the second data lines 113 that can represent the values of information to be read from or to be programmed into the memory cells 103. The column decoder 108 can selectively activate the CSEL1 through CSELn signals based on the A0 through AX address signals on the address lines 109. The select circuit 140 can select the signals on the first data lines 106 and the second data lines 113 to provide communication between the memory array 102 and the I/O circuit 117 during read and programming operations.

The memory array 102 of FIG. 1 may be a NAND memory array, and FIG. 2 shows a block diagram of a three-dimensional NAND memory device 200 which may be utilized for the memory array 102 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device 2101 is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It would be desirable to develop improved memory cell designs, improved memory array architecture (e.g., improved NAND architecture), and methods for fabricating the improved memory cells and improved memory array architectures.

BRIEF DESCRIPTION OF THE DRAWINGS

FIGS. 5-24 are diagrammatic cross-sectional views of regions of a construction at example process steps of an example method for fabricating an example assembly.

DETAILED DESCRIPTION OF THE ILLUSTRATED EMBODIMENTS

Figure 1:
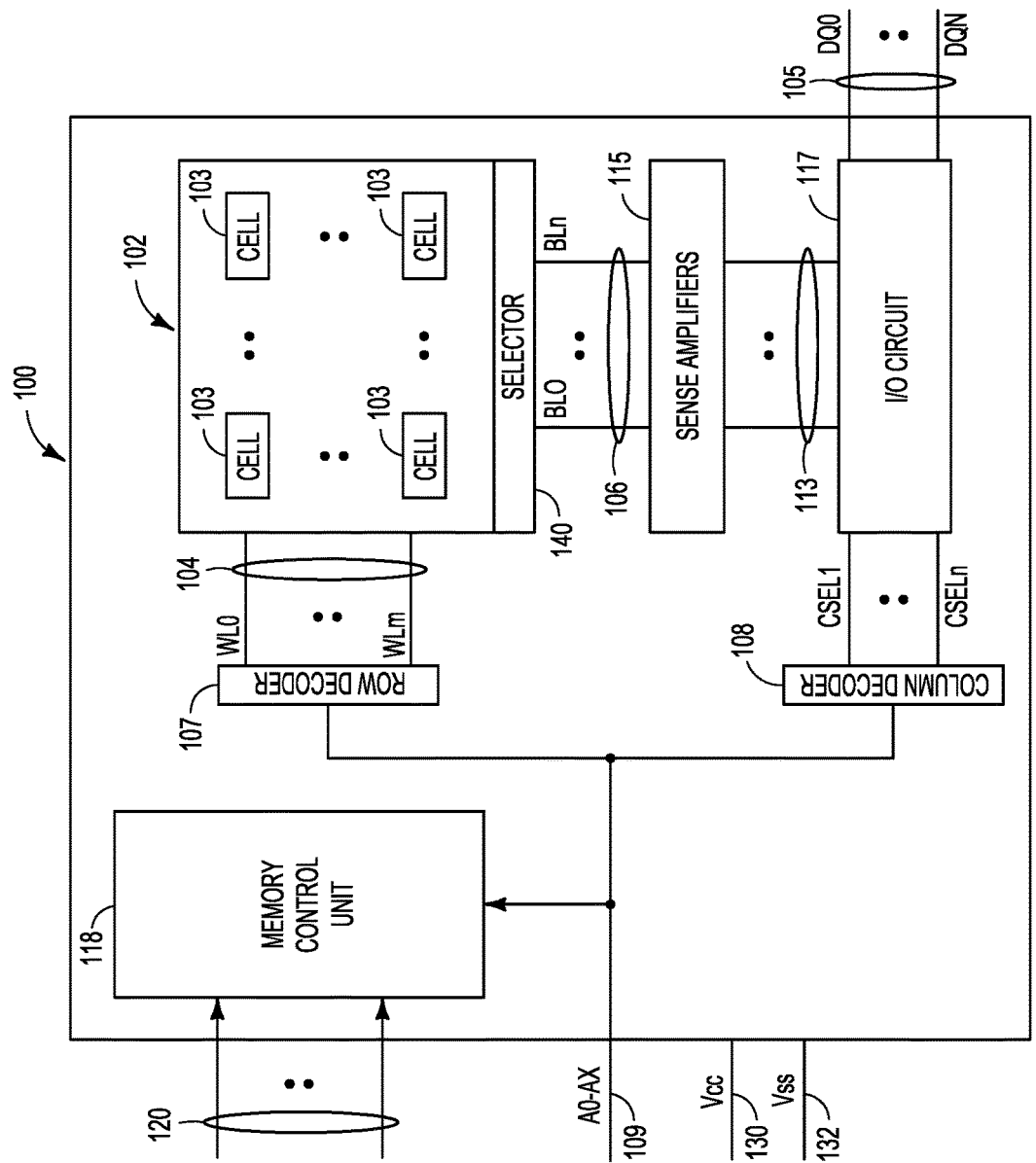
FIG. 1 shows a block diagram of a prior art memory device having a memory array with memory cells.
Figure 2:
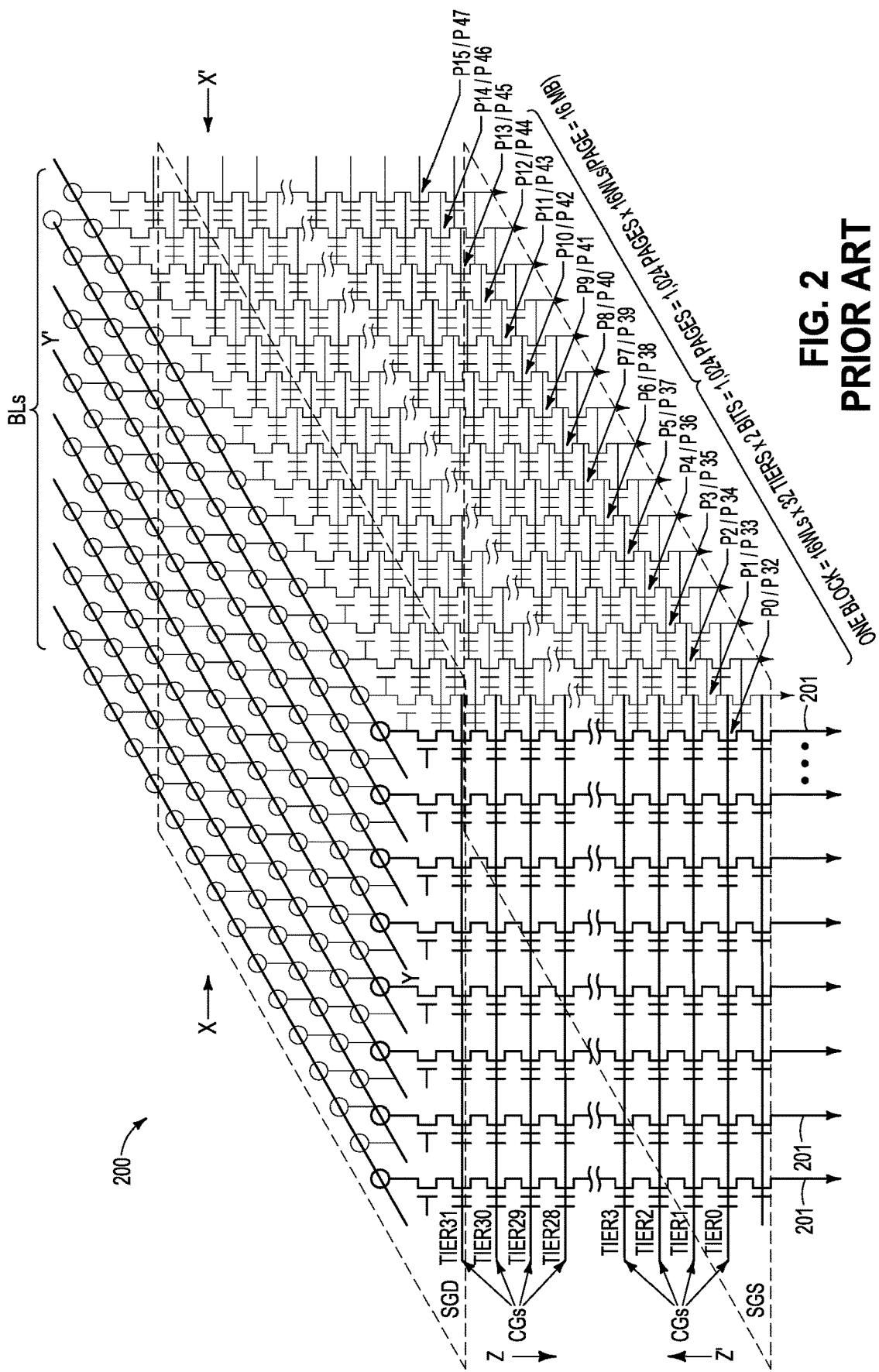
FIG. 2 shows a schematic diagram of the prior art memory array of FIG. 1 in the form of a 3D NAND memory device.
Figure 3:
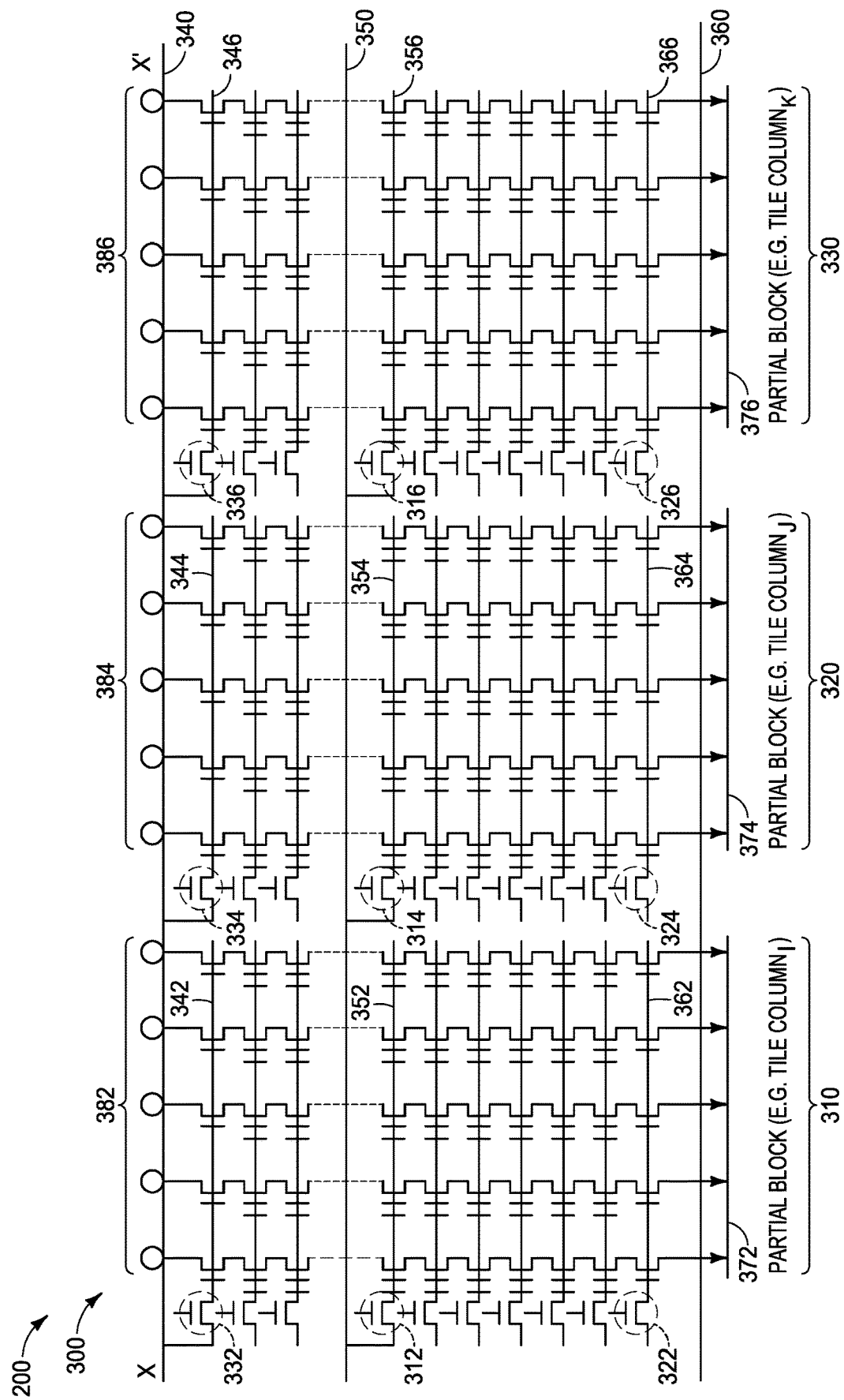
FIG. 3 shows a cross-sectional view of the prior art 3D NAND memory device of FIG. 2 in an X-X' direction.
Figure 4:
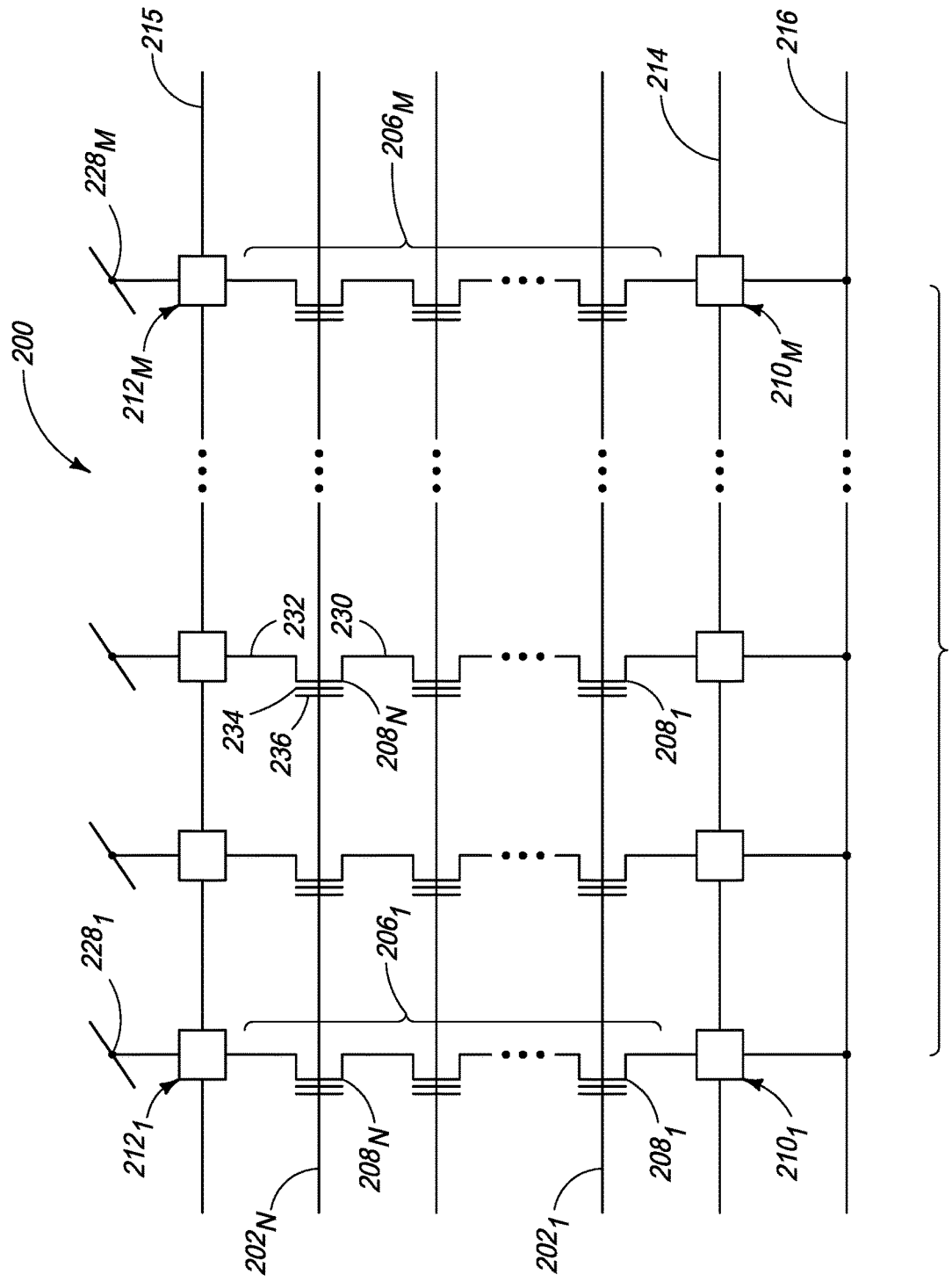
FIG. 4 is a schematic diagram of a prior art NAND memory array.

Some embodiments include memory arrays having low-density silicon dioxide wrapping around ends of wordline levels. Some embodiments include memory cells having charge-blocking regions which comprise silicon oxynitride. The charge-blocking regions may additionally comprise silicon dioxide. Some embodiments include memory arrays (e.g., NAND memory arrays) having vertically-stacked memory cells, and having voids between vertically-adjacent memory cells. Some embodiments include methods of forming memory cells, and memory arrays. Example methods are described with reference to FIGS. 5-26, and example architectures are described with reference to FIGS. 24 and 26.

Referring to FIG. 5, a construction (i.e., assembly, architecture, etc.) 10 includes a stack 12 of alternating first and second levels 14 and 16. The first levels 14 comprise first material 18, and the second levels 16 comprise second material 20. The first and second materials 18 and 20 may be any suitable materials. In some embodiments, the first material 18 may comprise, consist essentially of, or consist of silicon nitride; and the second material 20 may comprise, consist essentially of, or consist of silicon dioxide.

The levels 14 and 16 may be of any suitable thicknesses; and may be the same thickness as one another, or different thicknesses relative to one another. In some embodiments, the levels 14 and 16 may have vertical thicknesses within a range of from about 10 nanometers (nm) to about 400 nm. In some embodiments, the second levels 16 may be thicker than the first levels 14. For instance, in some embodiments the second levels 16 may have thicknesses within a range of from about 20 nm to about 40 nm, and the first levels 14 may have thicknesses within a range of from about 15 nm to about 30 nm.

Some of the material 20 of the second levels 16 is ultimately replaced with conductive material of memory cell gates. Accordingly, the levels 16 may ultimately correspond to memory cell levels of a NAND configuration. The NAND configuration will include strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc. A portion or portions of the cell levels may be used as select gate(s). The vertical stack 12 is shown to extend outwardly beyond the illustrated region of the stack to indicate that there may be more vertically-stacked levels than those specifically illustrated in the diagram of FIG. 5.

The stack 12 is shown to be supported over a base 22. The base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

A space is provided between the stack 12 and the base 22 to indicate that other components and materials may be provided between the stack 12 and the base 22. Such other components and materials may comprise additional levels of the stack, a source line level, source-side select gates (SGSs), etc.

Figure 6A:
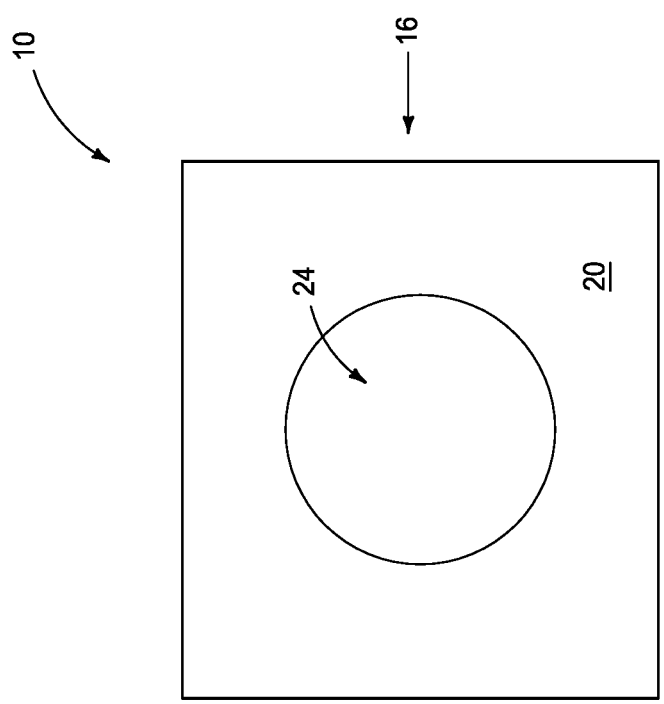
FIGS. 6A and 19A are diagrammatic top views along the lines A-A of FIGS. 6 and 19, respectively.

Referring to FIG. 6, an opening 24 is formed through the stack 12. The opening is ultimately utilized for fabricating channel material pillars associated with vertically-stacked memory cells of a memory array, and in some embodiments may be referred to as a pillar opening. The opening 24 may have any suitable configuration when viewed from above; and in some example embodiments may be circular, elliptical, polygonal, etc. FIG. 6A shows a top view of a portion of the top level 16 of the illustrated region of construction 10, and illustrates an example configuration in which the opening 24 is circular-shaped when viewed from above. In some embodiments, the opening 24 may be referred to as a first opening in order to distinguish it from other openings formed at later process stages. The pillar opening 24 may be representative of a large plurality of substantially identical openings formed across the base 22 at the processing stage of FIG. 6 (with the term "substantially identical" meaning identical to within reasonable tolerances of fabrication and measurement).

Figure 7:
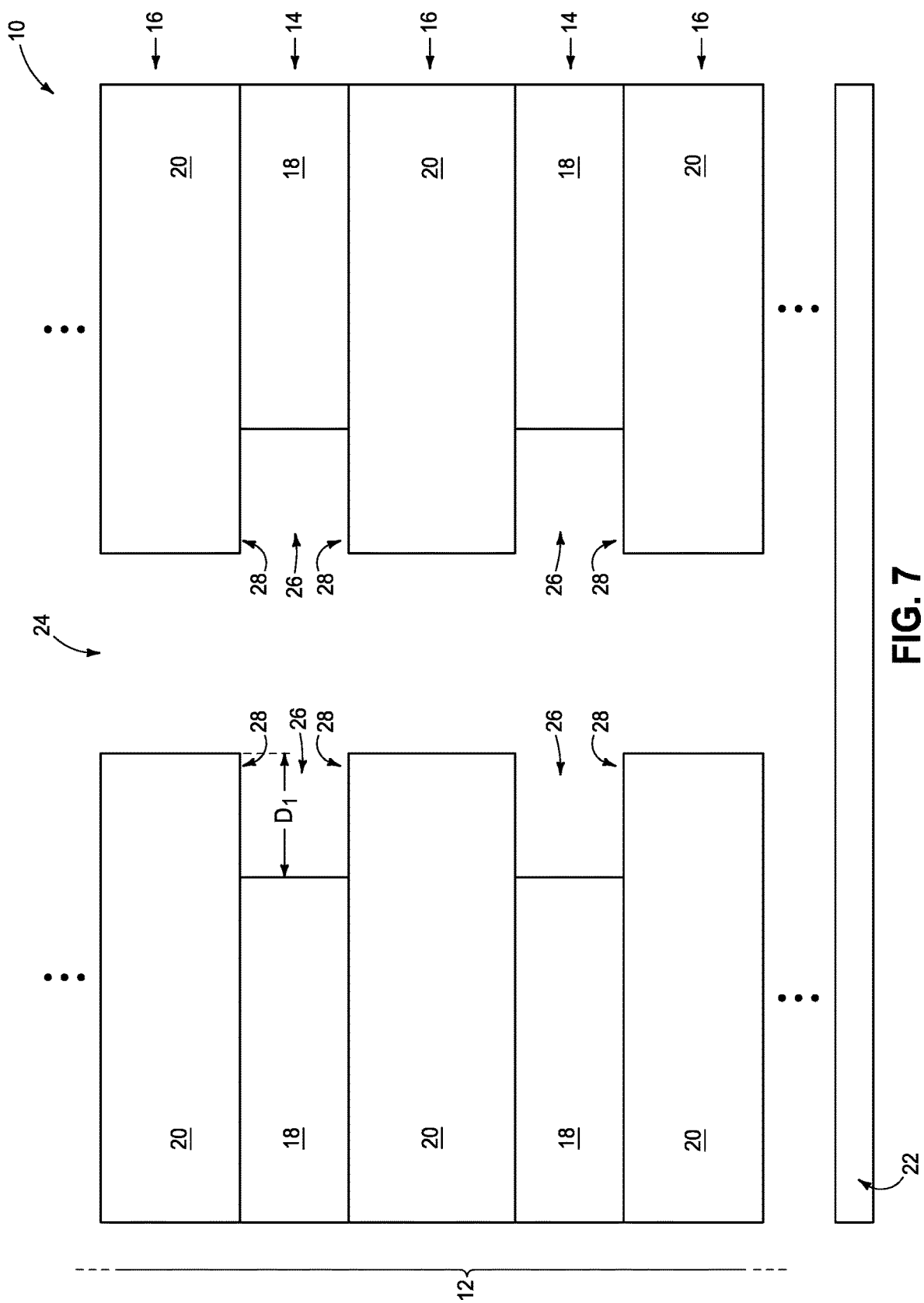

Referring to FIG. 7, the material 18 of the first levels 14 is recessed along the opening 24 to form gaps (i.e., cavities) 26. The gaps 26 may be referred to as first gaps to distinguish them from other gaps formed at subsequent process stages.

In some embodiments, the material 18 of the first levels 14 may comprise, consist essentially of, or consist of silicon nitride; and the material 20 of the second levels 16 may comprise, consist essentially of, or consist of silicon dioxide. In such embodiments, the material 18 may be selectively etched relative to the material 20 utilizing phosphoric acid. The term "selective etching" means that a material is removed faster than another material, and includes, but is not limited to, etching processes which are 100% selective for one material relative to another.

The first gaps 26 are vertically between segments 28 of the material 20 of the second levels 16.

The first gaps extend into the first levels 14 to a depth D1. Such depth may be any suitable depth, and in some embodiments will be within a range of from about 10 nm to about 20 nm.

Figure 8:
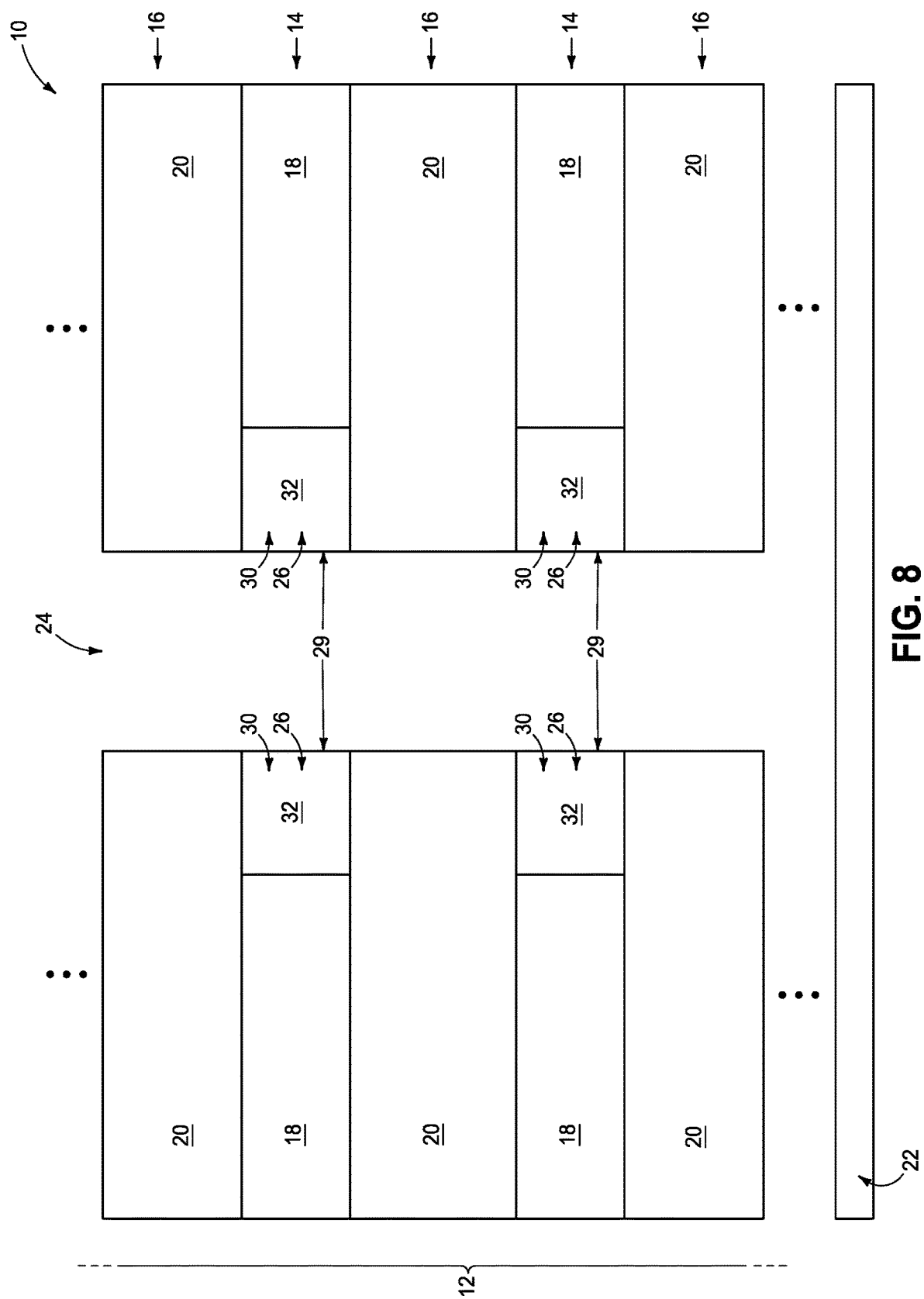

Referring to FIG. 8, spacing structures 30 are formed within the first gaps 26. The spacing structures 30 comprise material 32. Such material may comprise any suitable composition(s); and in some embodiments may comprise silicon. For instance, in some example embodiments, the material 32 may comprise, consist essentially of, or consist of polycrystalline silicon. The spacing structures 30 comprise outer edges 29 along the opening 24.

The material 32 may be formed within the gaps 26 with any suitable processing. For instance, in some embodiments material 32 may be deposited through the opening 24 and into the gaps 26; resulting in the gaps 26 being filled with the material 32 and the opening 24 being at least partially filled with the material 32. Subsequently, an etch may be utilized to remove excess material 32 from within the opening 24, while leaving the material 32 within the gaps 26. The etch may utilize any suitable etchant and etching conditions. In some example embodiments, the etch will utilize tetramethylammonium hydroxide (TMAH).

Figure 9:
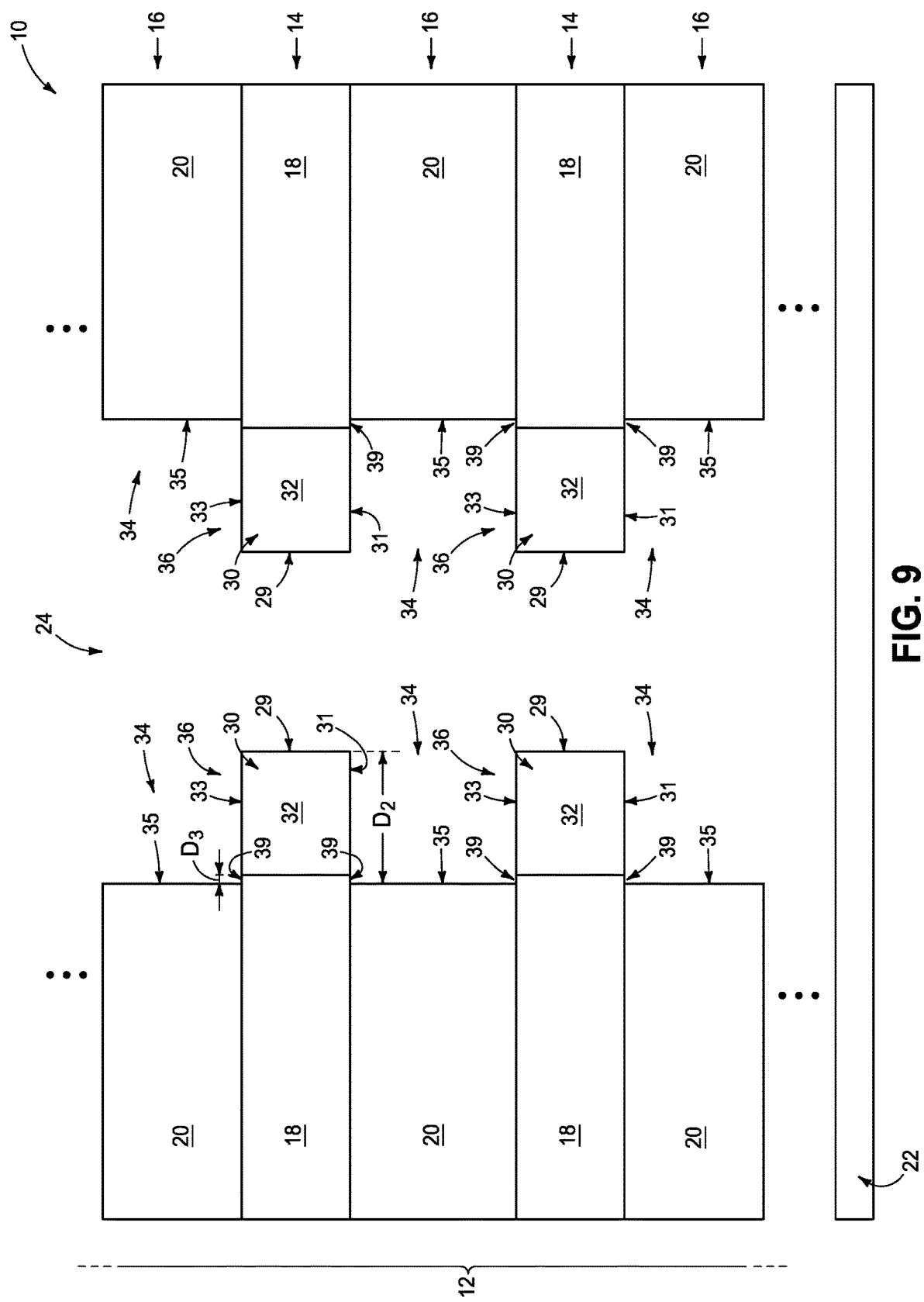

Referring to FIG. 9, the material 20 of the second levels 16 is recessed along the opening 24 to form second gaps 34. In some embodiments, the material 20 of the second levels 16 may comprise, consist essentially of, or consist of silicon dioxide; and the material 32 of the spacing structures 30 may comprise, consist essentially of, or consist of polycrystalline silicon. In such embodiments, the material 20 may be selectively etched relative to the material 32 utilizing a buffered oxide etch (e.g., an etch utilizing a hydrofluoric acid and a buffering agent, such as ammonium fluoride). The gaps 34 are vertically between segments 36 of the spacing structures 30. Remaining portions of the second material 20 are behind the gaps 34 (and in some embodiments may be referred to as being along the gaps 34).

The second gaps 34 extend into the first levels 14 to a depth D2. Such depth may be any suitable depth, and in some embodiments will be within a range of from about 10 nm to about 30 nm.

In some embodiments, the second gaps 34 may be each considered to comprise an upper periphery (or upper peripheral surface) 31, a lower periphery (or lower peripheral surface) 33, and an inner periphery (or inner peripheral surface) 35; with the inner periphery extending between the upper periphery and the lower periphery.

In the illustrated embodiment, regions 39 of the first material 18 are exposed along back portions of the second gaps 34. The exposed regions are along a depth D3 at the back of the second gaps 34. In some embodiments, the depth D3 may be within a range of from about 5 angstroms (Å) to about 70 Å. In alternative embodiments, regions of the first material 18 are not exposed along the back portions of the second gaps.

Figure 10:
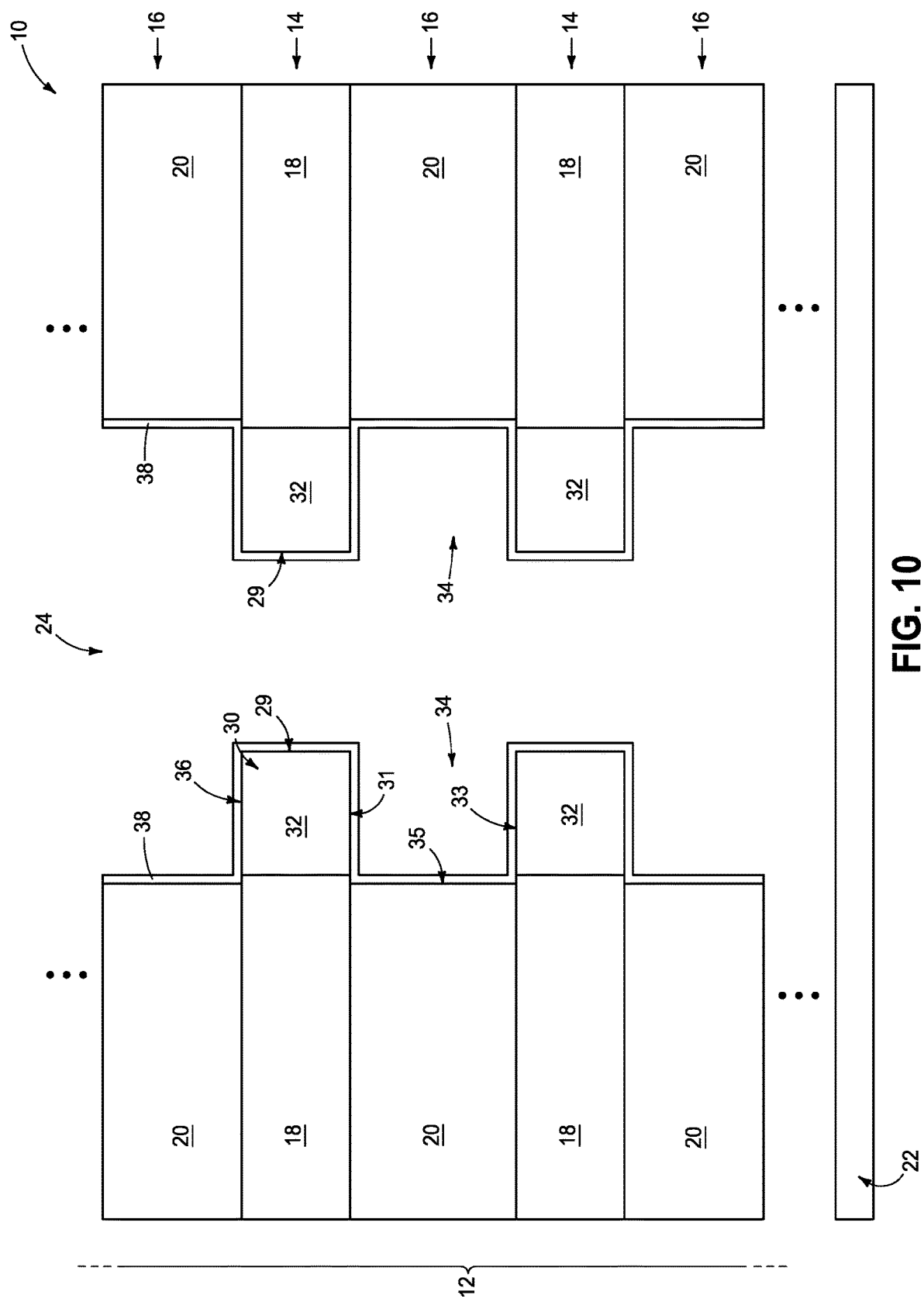

Referring to FIG. 10, a layer of dielectric barrier material 38 is formed to extend conformally along the peripheral surfaces 31, 33 and 35 within the gaps 34; and to extend along the outer edges 29 of the spacing structures 30. The dielectric barrier material 38 may comprise any suitable composition(s); and in some embodiments may comprise one or more high-k materials (with the term high-k meaning a dielectric constant greater than that of silicon dioxide). Example compositions which may be incorporated into the dielectric barrier material are hafnium oxide, zirconium oxide, aluminum oxide, hafnium silicate, zirconium silicate, titanium oxide, gadolinium oxide, niobium oxide, tantalum oxide, etc.

The dielectric barrier material 38 narrows the second gaps 34.

Figure 11:
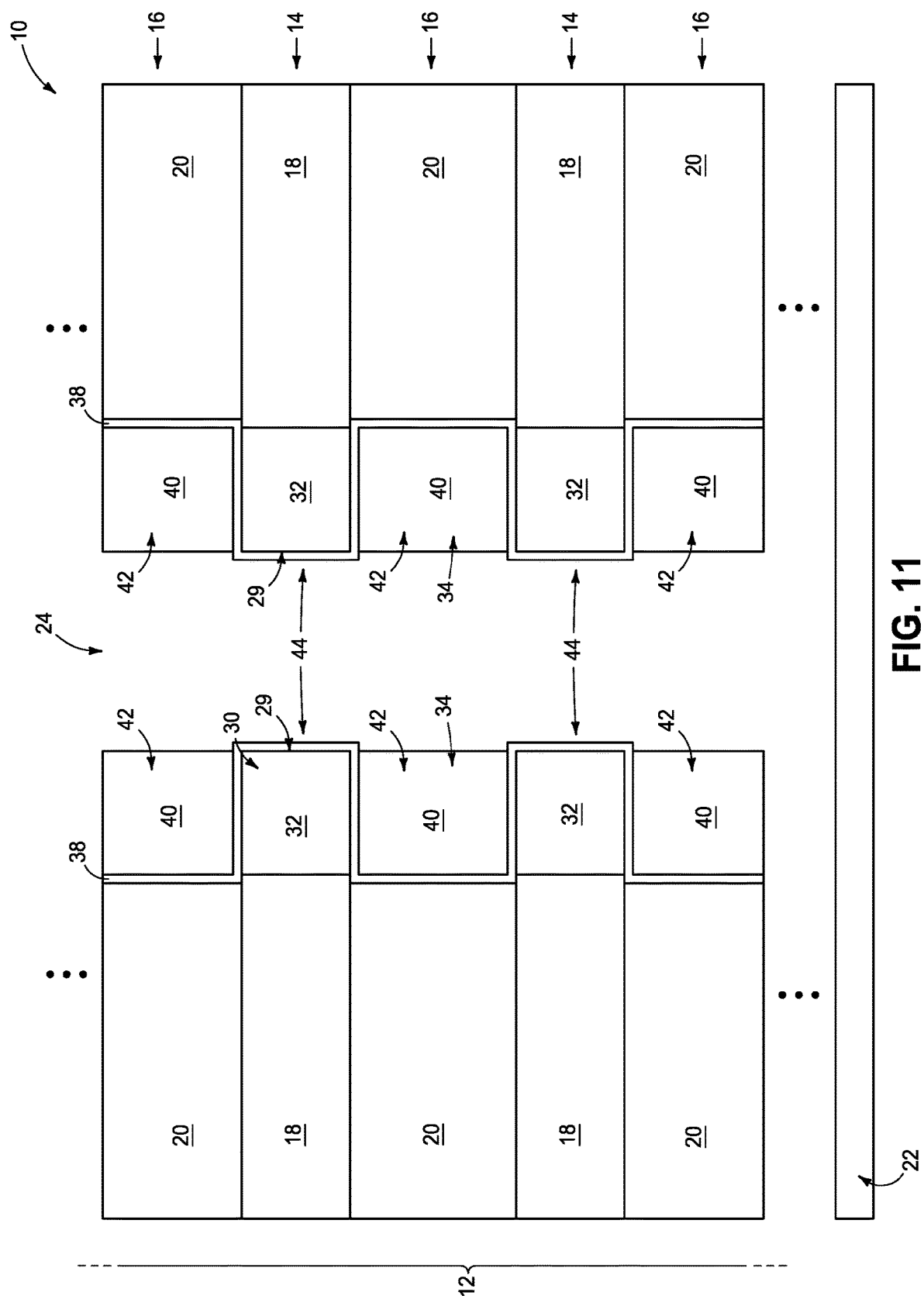

Referring to FIG. 11, a material 40 is formed within the narrowed gaps 34. In some embodiments, the material 40 may comprise, consist essentially of, or consist of silicon nitride. The material 40 may be formed in the shown configuration by initially providing a mass of the material 40 to at least partially fill the opening 24 (i.e., to extend within the gaps 34, and along outer edges 29 of the spacing structures 30; with the mass being spaced from the outer edges by the dielectric barrier material 38), and then removing some of the mass of material 40 while leave remaining portions of the material 40 within the gaps 34.

The material 40 at the processing stage of FIG. 11 may be considered to be configured as segments 42 which are within the gaps 34. Vertically-neighboring segments 42 are vertically-spaced from one another by intervening regions 44 which include the spacing structures 30.

Figure 12:
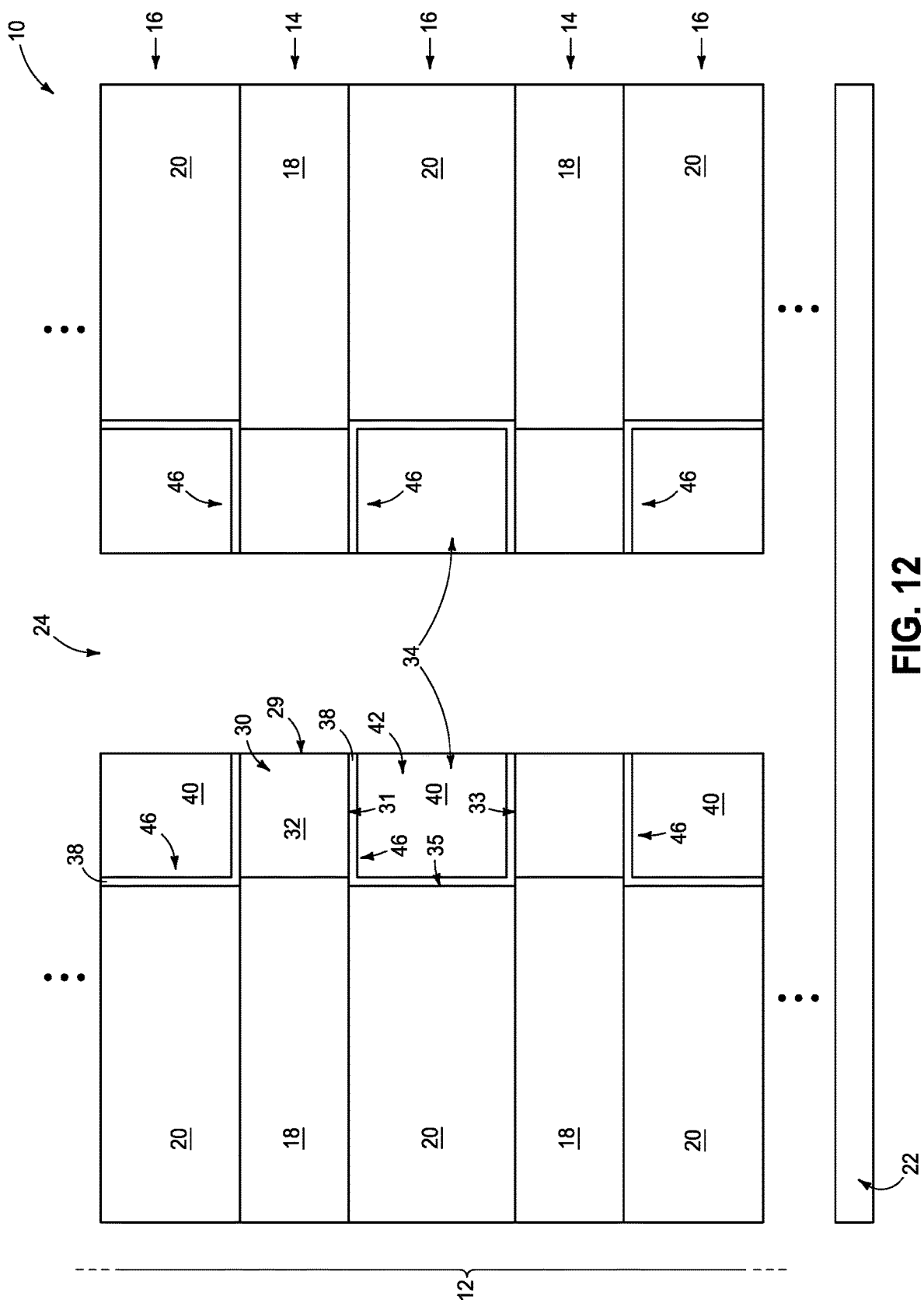

Referring to FIG. 12, regions of the dielectric material 38 are removed from along the outer edges 29 of the spacing structures 30 to expose such outer edges along the opening 24. The dielectric material 38 remaining at the processing stage of FIG. 12 may be considered to be configured as liners 46 extending within the cavities 34, and along the peripheral surfaces 31, 33 and 35 of such cavities.

Figure 13:
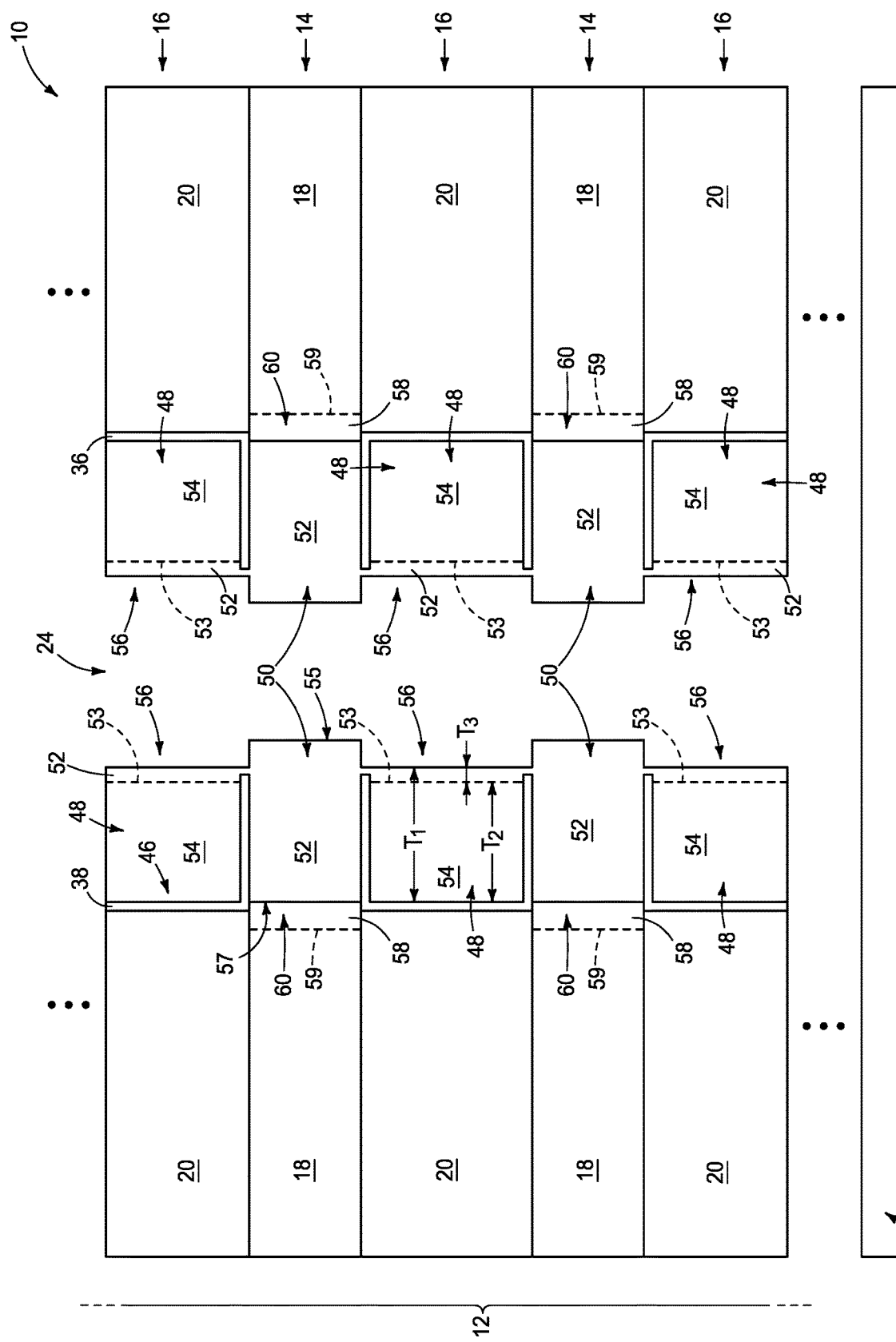

Referring to FIG. 13, the surfaces within opening 24 are exposed to oxidizing conditions which oxidize the segments 42 (FIG. 12) to form charge-blocking regions 48, and which also oxidize edges of the spacing structures 30 (FIG. 11) to form the ledges 50. The oxidizing conditions may utilize any suitable chemistry and operational parameters. In some example embodiments, the oxidizing conditions may comprise an operational temperature of the oxidizing ambient and/or the oxidizing surfaces of at least about 700° C. (but not limited to being at least about 700°, and may be lower if suitable oxidative conditions achieve desired electrical and/or other properties). The oxidizing conditions may, for example, utilize steam (for instance, in situ steam generation (ISSG)) as a source of the oxidant, and/or may utilize plasma to generate oxidizing species. The plasma may be a so-called "remote plasma", meaning that the plasma does not contact the surfaces within opening 24 which are to be oxidized, but instead only the oxidizing species generated by such plasma reach the oxidizing surfaces.

In some embodiments, the material 40 (FIG. 12) of the segments 42 (FIG. 12) comprises, consists essentially of, or consist of silicon nitride; and the material 32 (FIG. 12) of the spacing structures 30 (FIG. 12) comprises, consists essentially of, or consists of polycrystalline silicon. The oxidation may oxidize the silicon nitride 40 to form silicon oxynitride 54 and silicon dioxide 52; and may oxidize the polycrystalline silicon 32 to form additional silicon dioxide 52. In such embodiments, the charge-blocking regions 48 may comprise the silicon oxynitride 54 and the silicon dioxide 52 (as shown). Boundaries between the materials 52 and 54 are diagrammatically illustrated in FIG. 13 with dashed-lines 53 to indicate that the boundary between the materials 52 and 54 may be an abrupt interface between the silicon oxynitride and the silicon dioxide, or may be a gradient.

In some embodiments, at least portions of the charge-blocking regions 48 and/or the ledges 50 may be formed by deposition of suitable material(s) (e.g., silicon dioxide), followed by appropriate etching to achieve a desired shape (such as, for example, shapes analogous to the shapes of the charge-blocking regions 48 and ledges 50 shown in FIG. 13).

The charge-blocking regions 48 extend vertically, and have horizontal thicknesses T1. Such horizontal thicknesses may be of any suitable dimension, and in some embodiments may be within a range of from about 50 Å to about 150 Å. The silicon oxynitride material 54 of the charge-blocking regions has a horizontal thickness T2; and the silicon dioxide material 52 of the charge-blocking regions has a horizontal thickness T3. In some embodiments, the horizontal thickness T2 will be at least about double the horizontal thickness T3. In some embodiments, the horizontal thickness T2 will be within a range of from about 20 Å to about 140 Å; and the horizontal thickness T3 will be within a range of from about 10 Å to about 30 Å. In some embodiments, the horizontal thicknesses T2 and T3 may be referred to as first and second horizontal thicknesses in order to distinguish them from one another.

The oxidation of materials 32 and 40 (FIG. 11) may oxidize the polycrystalline silicon material 32 much faster than the silicon nitride material 40 (for instance, may oxidize the polycrystalline silicon at least 1.5 times as fast as the silicon nitride, at least twice as fast as the silicon nitride, at least three times as fast as the silicon nitride, etc.). In embodiments in which the oxidation induces much more expansion from the silicon dioxide 52 formed from the polycrystalline silicon 32 than from the silicon oxynitride 54/silicon dioxide 52 formed from the silicon nitride material 40, the edges of the tiers 16 along opening 24 may expand little, if at all, and the edges of the tiers 14 along opening 24 may expand substantially (e.g., the expansion due to the formation of the silicon dioxide 52 from polycrystalline silicon 32 material may be at a least about double the expansion due to the formation of the silicon oxynitride 54/silicon dioxide 52 from the silicon nitride material 40). In some embodiments there may be substantial expansion along the edges of the tiers 14 along the opening 24, and there may be substantially no expansion along the edges of the tiers 16 along the opening 24 (with the term "substantially no expansion" meaning no expansion to within reasonable tolerances of detection). The ledges 50 are shown to be horizontally longer than the charge-blocking regions 48. Third gaps 56 are along the second levels 16, and vertically between the ledges 50.

In the shown embodiment, silicon oxynitride 58 is formed along regions where silicon dioxide 52 of ledges 50 is adjacent the silicon nitride 18 of levels 14. Dashed-lines 59 are provided to show approximate boundaries between the silicon oxynitride 58 and the silicon nitride 18, and to indicate that such boundaries may be abrupt interfaces, or may be gradients. In some embodiments, the ledges 50 may be considered to comprise front edges 55 along the opening 24, and back edges 57 in opposing relation to the front edges 55; with the back edges 57 being adjacent the first material 18. The silicon oxynitride 58 is along the back edges 57 of the ledges 50, and may be configured as silicon oxynitride liners 60.

The silicon oxynitride 58 is optional, and in some embodiments may not be formed.

Figure 14:
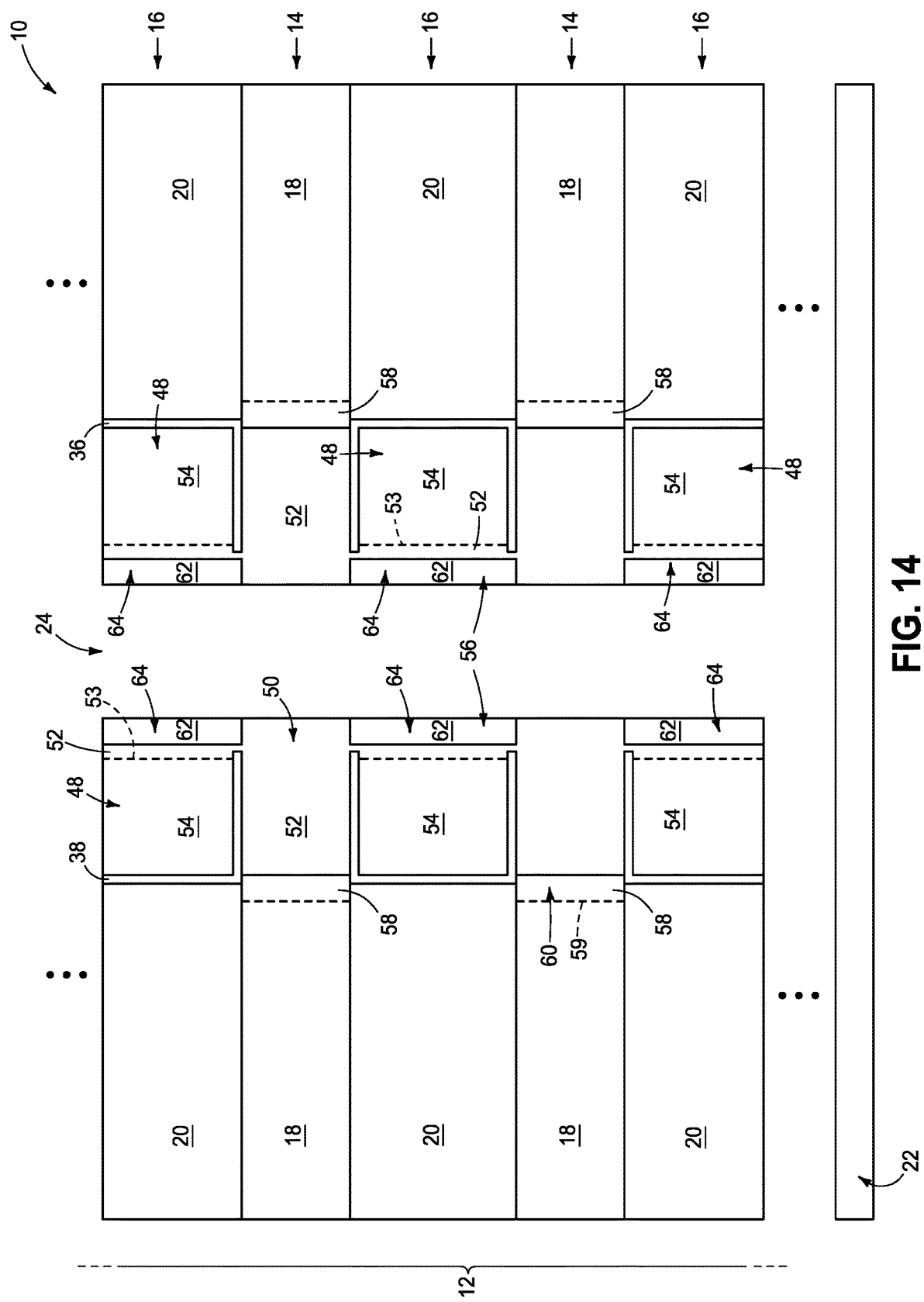

Referring to FIG. 14, charge-storage material 62 is formed within the gaps 56. The charge-storage material may comprise any suitable composition(s); and in some embodiments may comprise charge-trapping materials, such as silicon nitride, silicon oxynitride, conductive nanodots, etc.

Persons of ordinary skill in the art understand the term "charge-trapping"; and will understand that a "charge trap" may refer to an energy well that can reversibly capture a charge carrier (e.g., an electron or hole). In alternative embodiments (not shown), the charge-storage material may be configured as floating gate material (such as, for example, polycrystalline silicon).

The charge-storage material 62 may be formed in the shown configuration with any suitable methodology. For instance, in some embodiments the charge-storage material 62 may comprise, consist essentially of, or consist of silicon nitride, and may be initially formed to at least partially fill the opening 24. Excess material 62 may then be removed with a suitable etch (for instance, an etch utilizing hot phosphoric acid, an etch utilizing oxidation followed by hydrofluoric acid treatment, etc.) to leave only the material 62 which is confined within the gaps 56.

In some embodiments, the charge-storage material 62 may comprise silicon nitride, and the segments of the charge-storage material 62 remaining within the gaps 56 may be referred to as silicon nitride segments 64.

Figure 15:
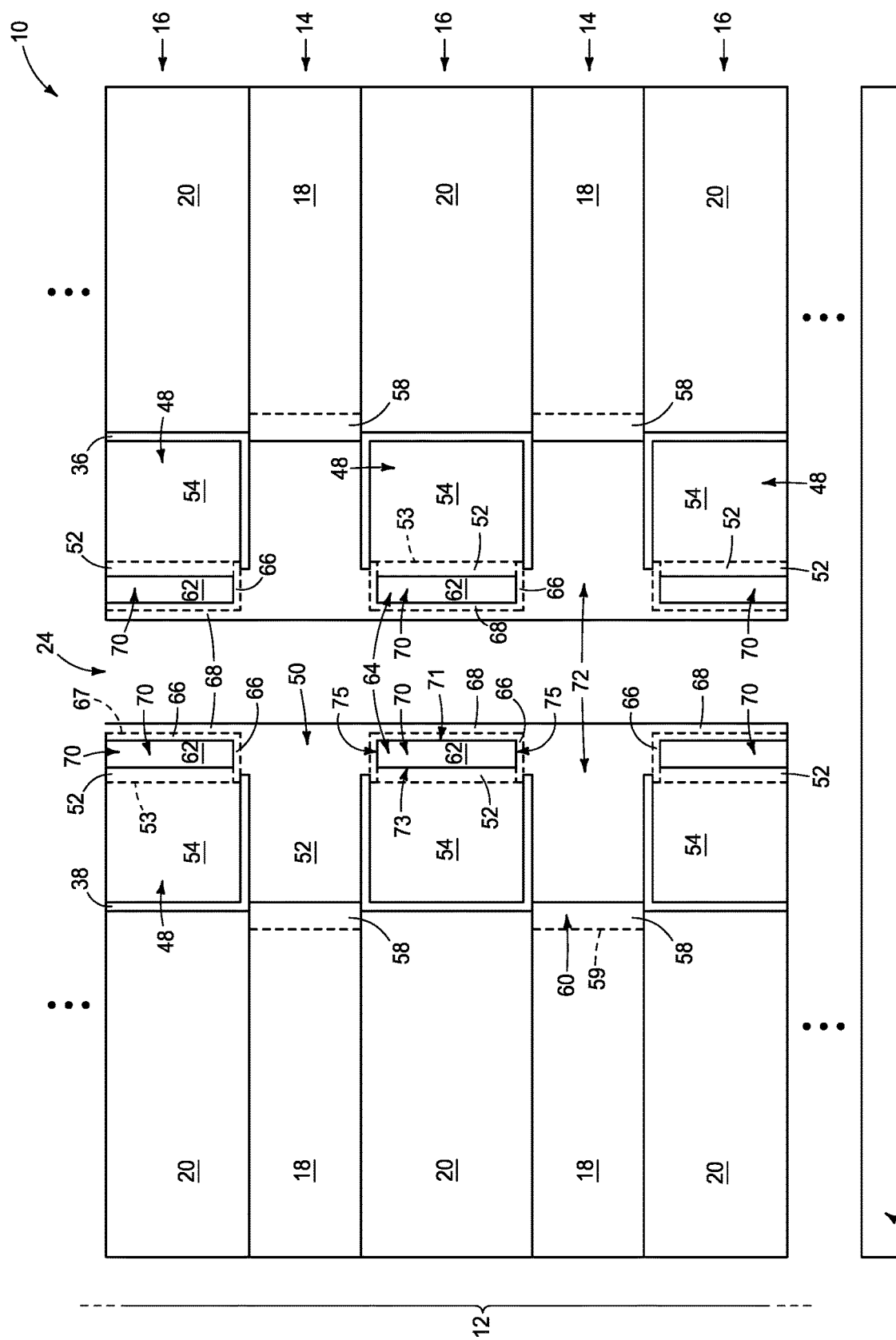

Referring to FIG. 15, edges of the silicon nitride segments 64 (FIG. 16) are oxidized to form silicon oxynitride 66 and silicon dioxide 68. Dashed lines 67 are utilized to illustrate approximate boundaries between the materials 66 and 68. The material 62 remaining after the formation of the silicon oxynitride 66 and the silicon dioxide 68 may be considered to correspond to charge-storage regions (e.g., charge-trapping regions) 70. The charge-trapping regions 70 have outer edges 71 adjacent the opening 24, inner edges 73 adjacent the charge-blocking regions 48, and horizontal edges 75 adjacent the ledges 50. In the illustrated embodiment, the silicon oxynitride 66 extends along the outer edges 71 and along the horizontal edges 75.

In some embodiments, the silicon oxynitride 66 may have a thickness within a range of from about 0.5 nm to about 3 nm, and the silicon dioxide 68 may have a thickness within a range of from about 0.5 nm to about 3 nm.

In the shown embodiment, the charge-storage regions 70 are along, and directly adjacent, the silicon dioxide 52 of the charge-blocking regions 48 (specifically, the inner edges 73 of the charge storage regions 70 are directly against such silicon dioxide 52).

Figure 16:
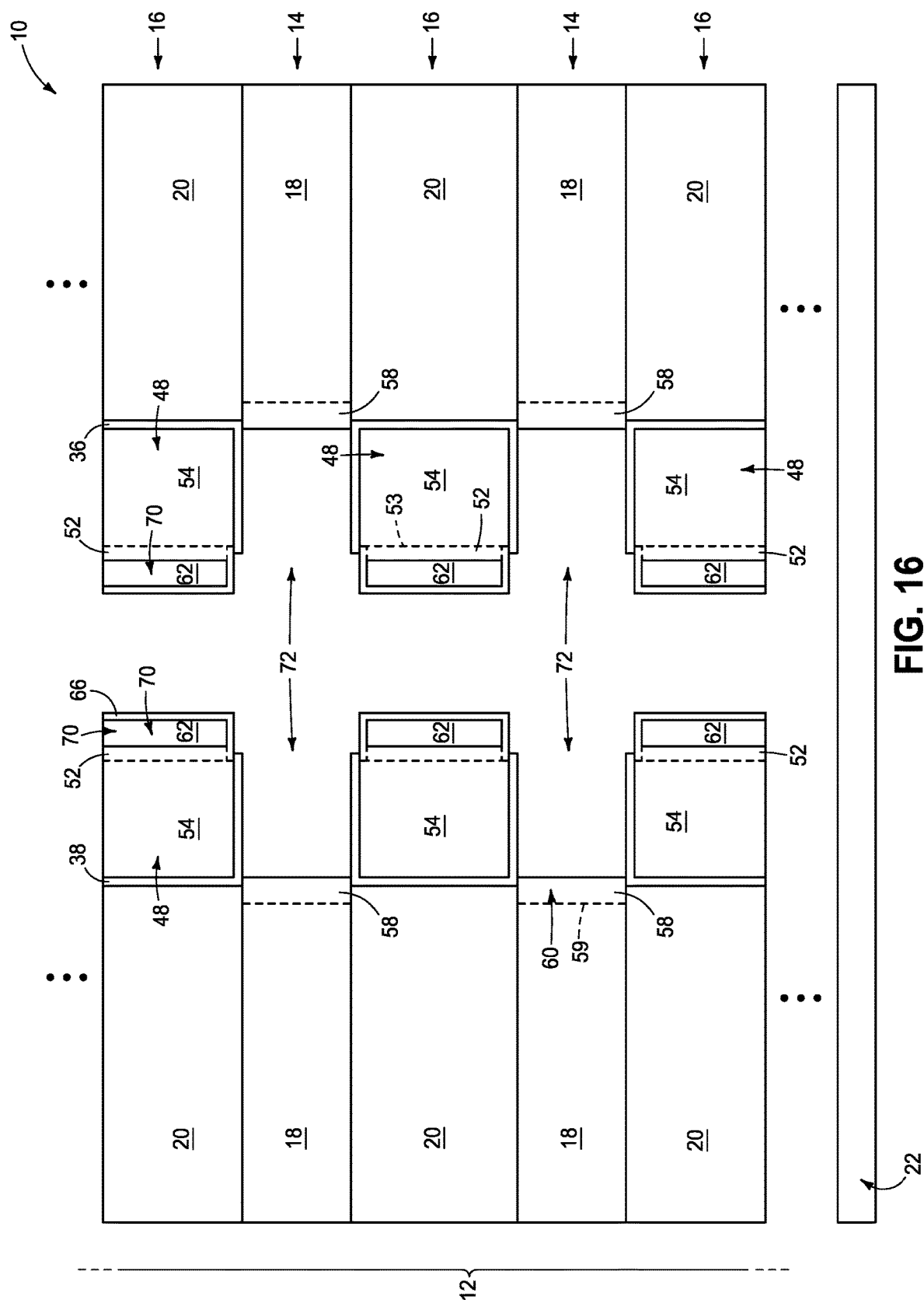

Referring to FIG. 16, the ledges 50 (FIG. 15) are removed to form fourth gaps 72, with the fourth gaps being vertically between the charge-trapping regions 70. In some embodiments, the material 52 (FIG. 15) of the ledges 50 comprises silicon dioxide, and such material is removed selectively relative to other materials of construction 10 (for instance, by utilizing a buffered oxide etch).

Figure 17:
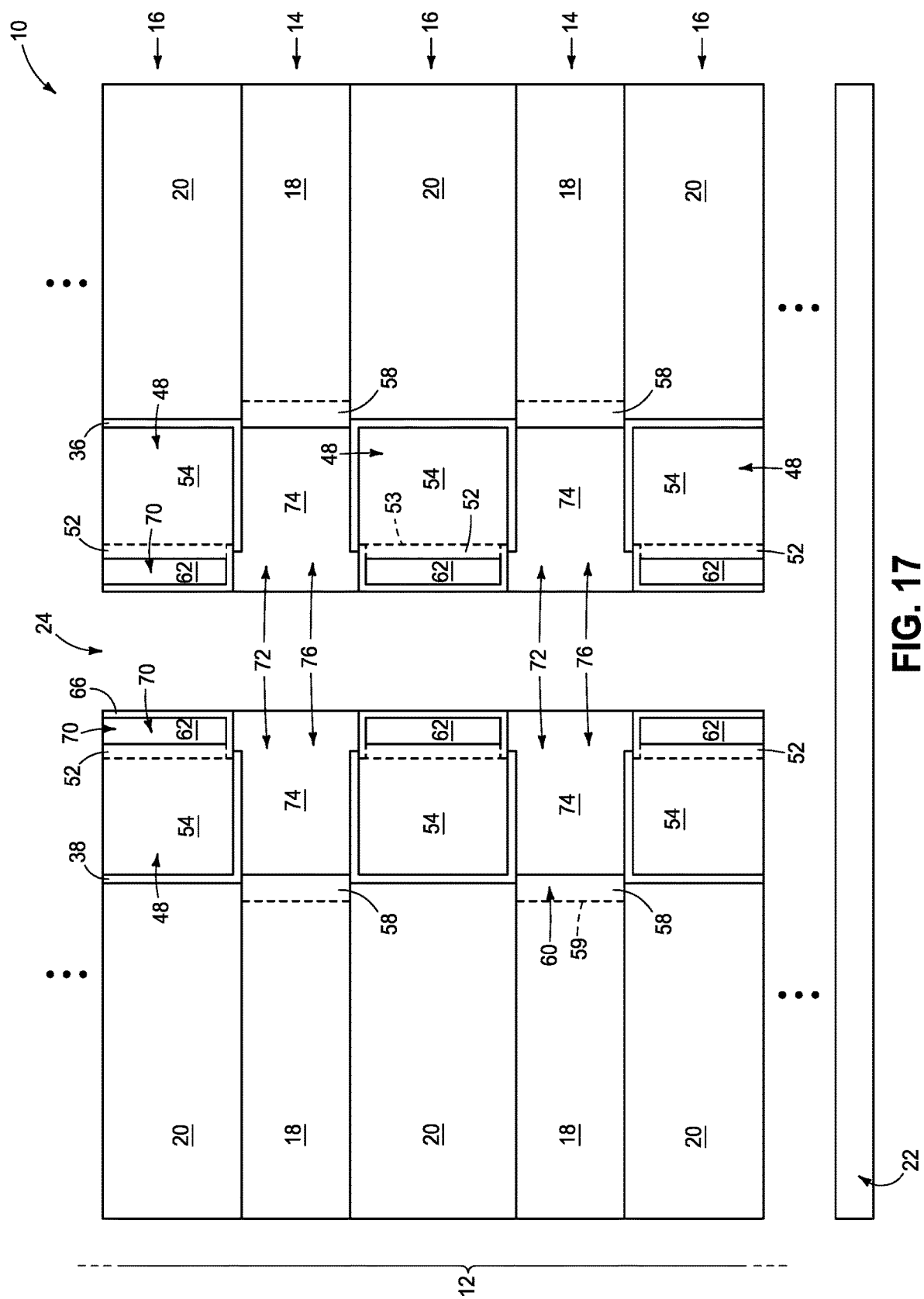

Referring to FIG. 17, material 74 is formed within the gaps 72. In some embodiments, the material 74 may comprise, consist essentially of, or consist of silicon nitride; and may be considered to be configured as silicon nitride segments 76. The silicon nitride segments 76 may be referred to as third silicon nitride segments. In some embodiments, the material 18 of the first levels 14 may be referred to as first silicon nitride, and the material 74 may be referred to as second silicon nitride which replaces some of the first silicon nitride.

The silicon nitride segments 74 may be formed with any suitable processing. For instance, opening 24 may be at least partially filled with silicon nitride, and then excess silicon nitride may be removed with appropriate etching to leave the segments 74 within the gaps 72.

The silicon nitride segments 76 are along the first levels 14, and are adjacent the first material 18 (which in some embodiments may be silicon nitride). In the shown embodiment, the silicon oxynitride 58 is between the silicon nitride segments 76 and the first material 18. In other embodiments, the silicon oxynitride 58 may be omitted.

Figure 18:
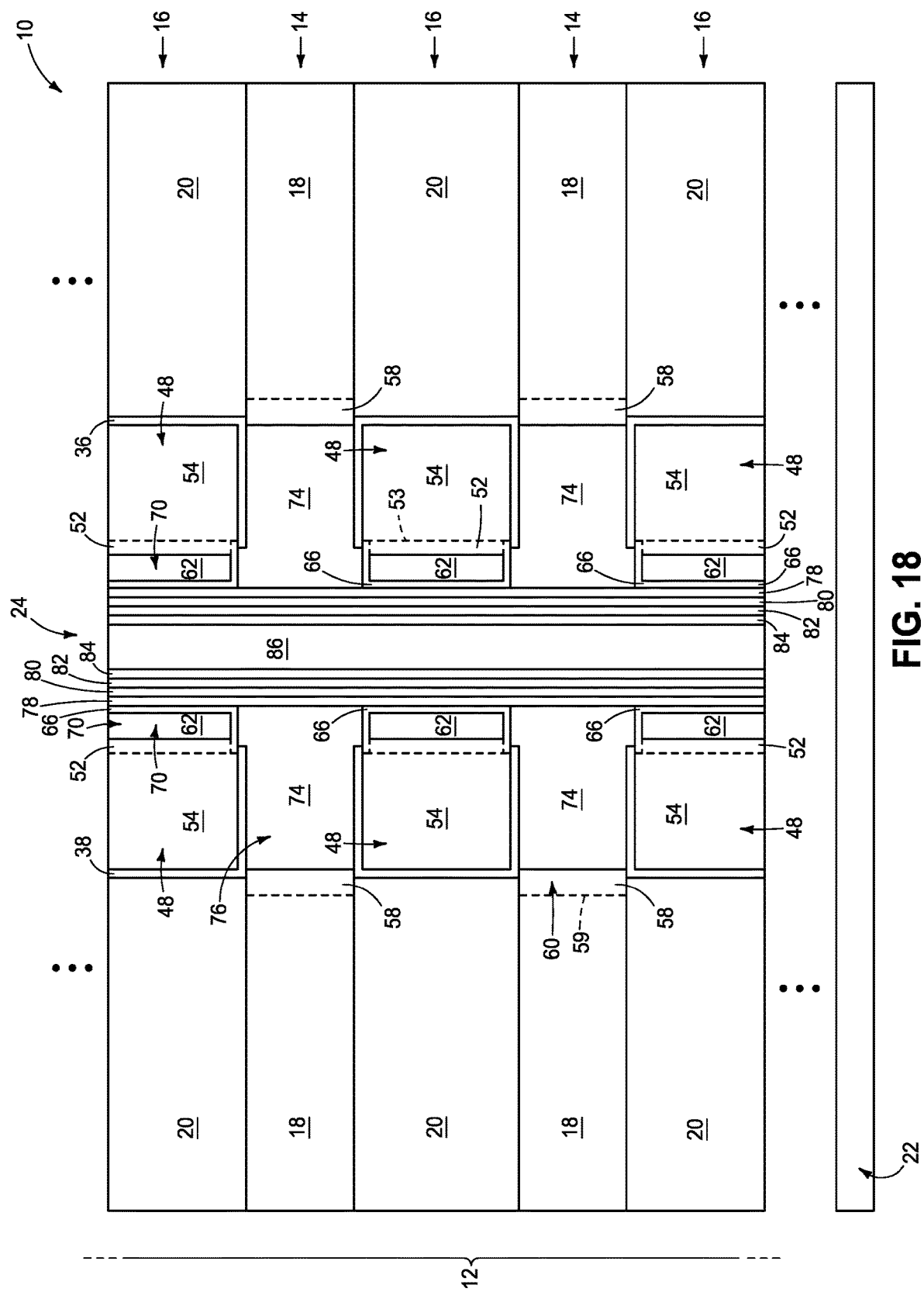

Referring to FIG. 18, tunneling materials 78, 80 and 82 are formed along an outer periphery of the opening 24.

The tunneling materials can function as materials through which charge carriers tunnel or otherwise pass during programming operations, erasing operations, etc. In some contexts, one or more of the tunneling materials may be referred to as gate dielectric material, or simply as dielectric material. In the illustrated embodiment, three tunneling materials are utilized. In other embodiments, there may be fewer than three tunneling materials; and in yet other embodiments there may be more than three tunneling materials. In some embodiments, the tunneling materials 78, 80 and 82 may be band-gap engineered to have desired charge tunneling properties. The tunneling material 80 is compositionally different from the materials 78 and 82. The materials 78 and 82 may be compositionally different from one another in some embodiments, and may be compositionally the same as one another in other embodiments. In the illustrated embodiment, the silicon oxynitride 66 may correspond to an additional tunneling material. In some embodiments, one or more of the tunneling materials 78, 80 and 82 may be omitted; and instead the function of such tunneling material may be encompassed with the silicon oxynitride 66.

In some example embodiments, the tunneling material 80 may comprise silicon nitride, and the tunneling materials 78 and 82 may comprise silicon dioxide. In some example embodiments, the tunneling materials 66 and 78 may comprise silicon oxynitride and silicon dioxide, respectively; the tunneling material 80 may comprise silicon nitride, and the tunneling material 82 may comprise silicon dioxide.

In some embodiments, the tunneling materials 78, 80 and 82 may be referred to as first, second and third tunneling materials, respectively.

Channel material 84 is formed within the opening 24 and along the tunneling materials 78, 80 and 82. In the illustrated embodiment, the channel material 84 is directly against the tunneling material 82. The channel material 84 may comprise any suitable appropriately-doped semiconductor material(s); and in some embodiments may comprise one or more of silicon, germanium, III/V semiconductor materials (e.g., gallium phosphide), etc.

In the illustrated embodiment, the channel material 84 lines a periphery of the opening 24, and insulative material 86 fills a remaining interior region of the opening 24. The insulative material 86 may comprise any suitable composition or combination of compositions, such as, for example, silicon dioxide. The illustrated configuration of the channel material 84 may be considered to be a hollow channel configuration, in that the insulative material 86 is provided within a "hollow" in the channel configuration. In other embodiments, the channel material may be configured as a solid pillar.

The channel material 84 extends vertically along the periphery of opening 24; or, in other words, extends vertically through the stack 12.

Figure 19:
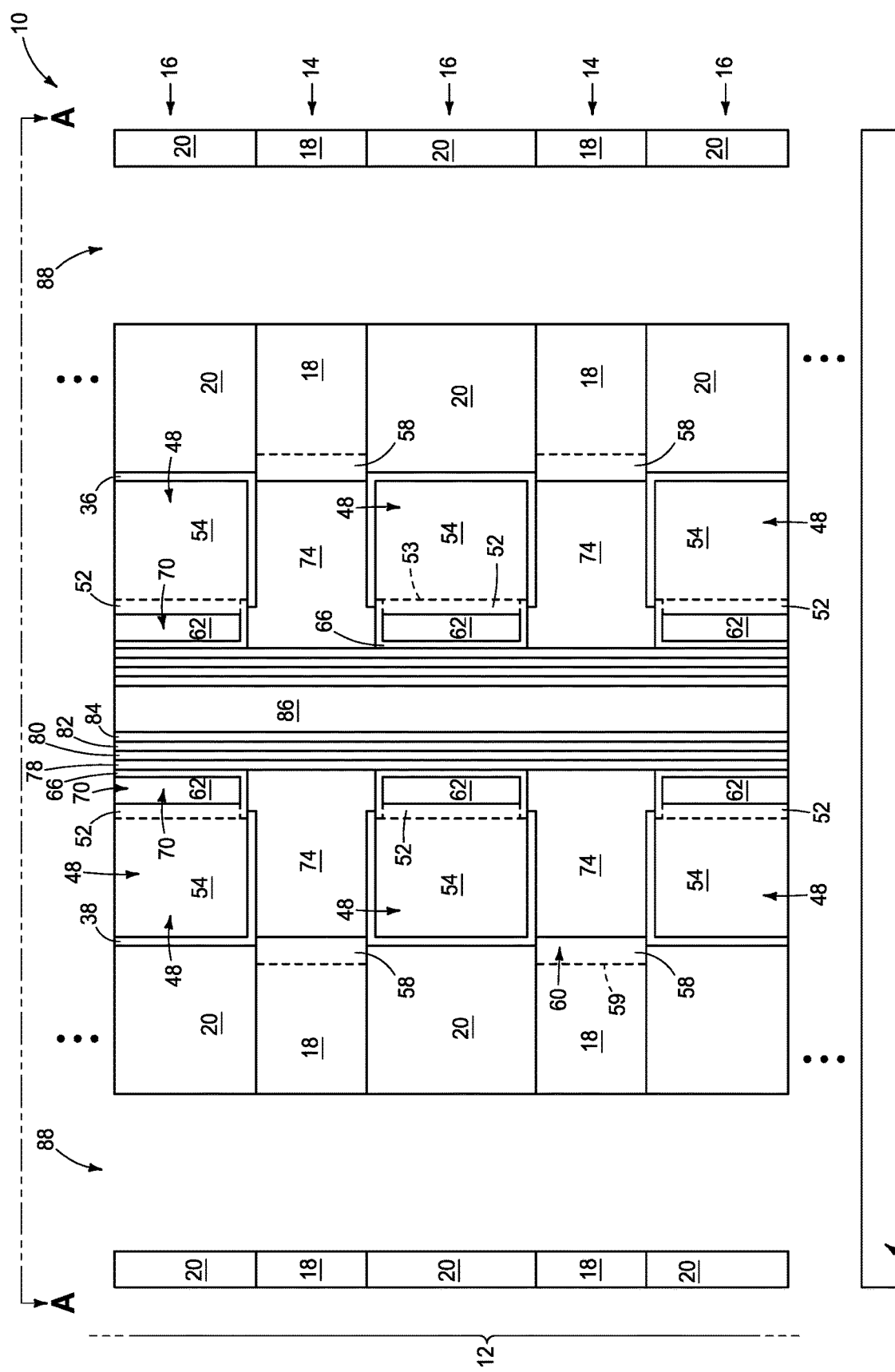

Referring to FIG. 19, second openings 88 are formed through the stack 12. The second openings 88 extend through the portions of the first and second materials 18 and 20.

Figure 19A:
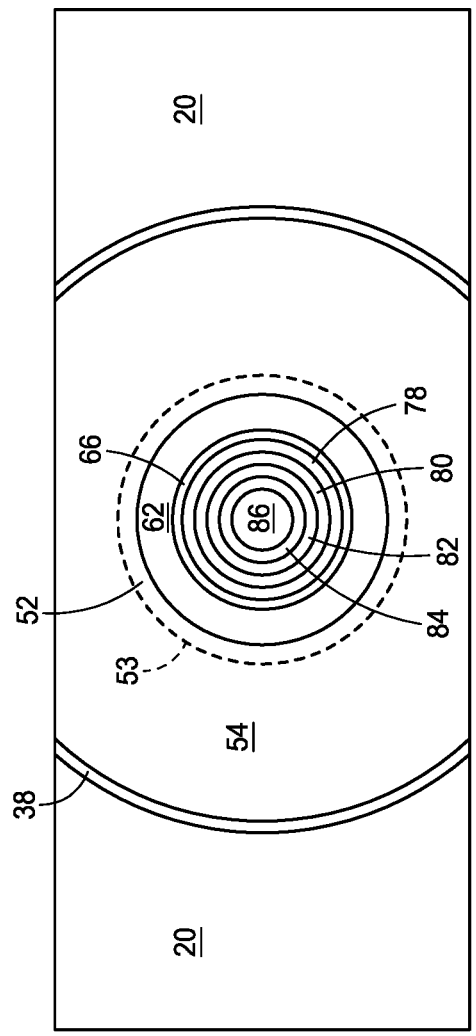

FIG. 19A shows a top view of a portion of the top level 16 of the illustrated region of construction 10, and illustrates an example configuration in which the second openings 88 are configured as slits (i.e., trenches).

Figure 20:
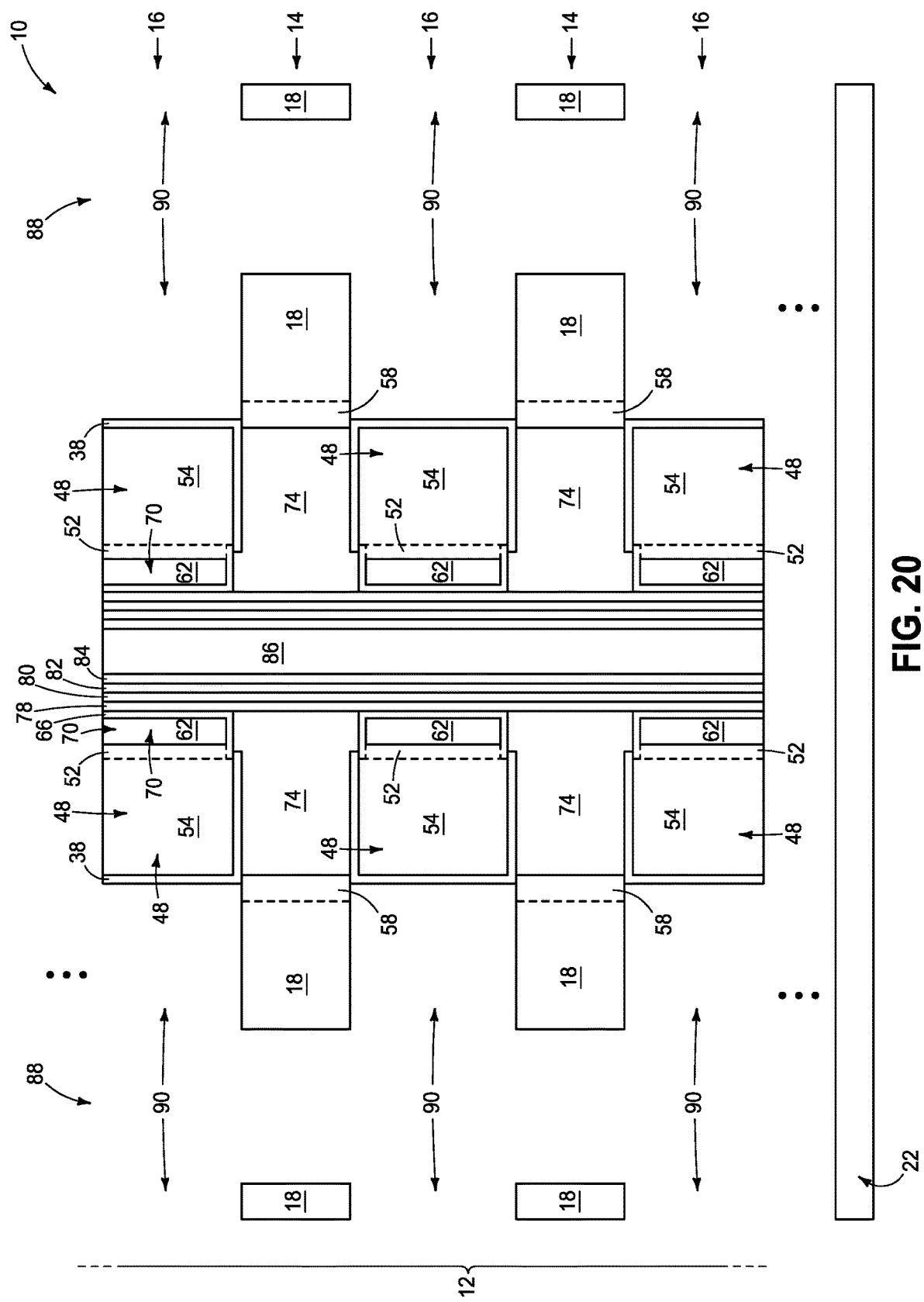

Referring to FIG. 20, the material 20 (FIG. 19) of the second levels 16 is removed to form cavities 90 along the second levels 16. In some embodiments, the material 20 comprises silicon dioxide, and is removed with a buffered oxide etch.

Figure 21:
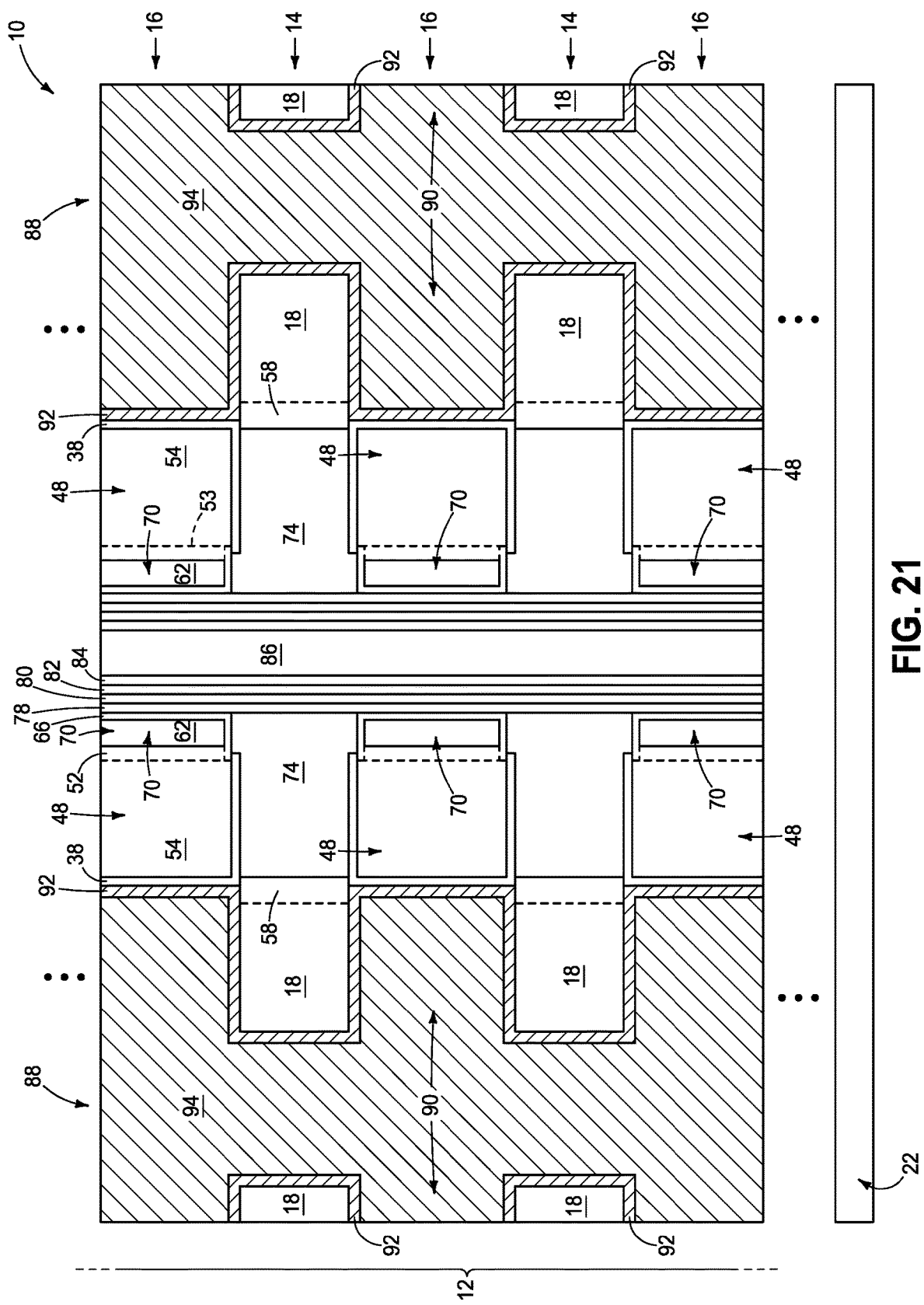

Referring to FIG. 21, conductive materials 92 and 94 are provided within the openings 88 and the cavities 90. The conductive materials 92 and 94 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 92 may comprise, consist essentially of, or consist of titanium nitride; and the conductive material 94 may comprise, consist essentially of, or consist of tungsten.

Figure 22:
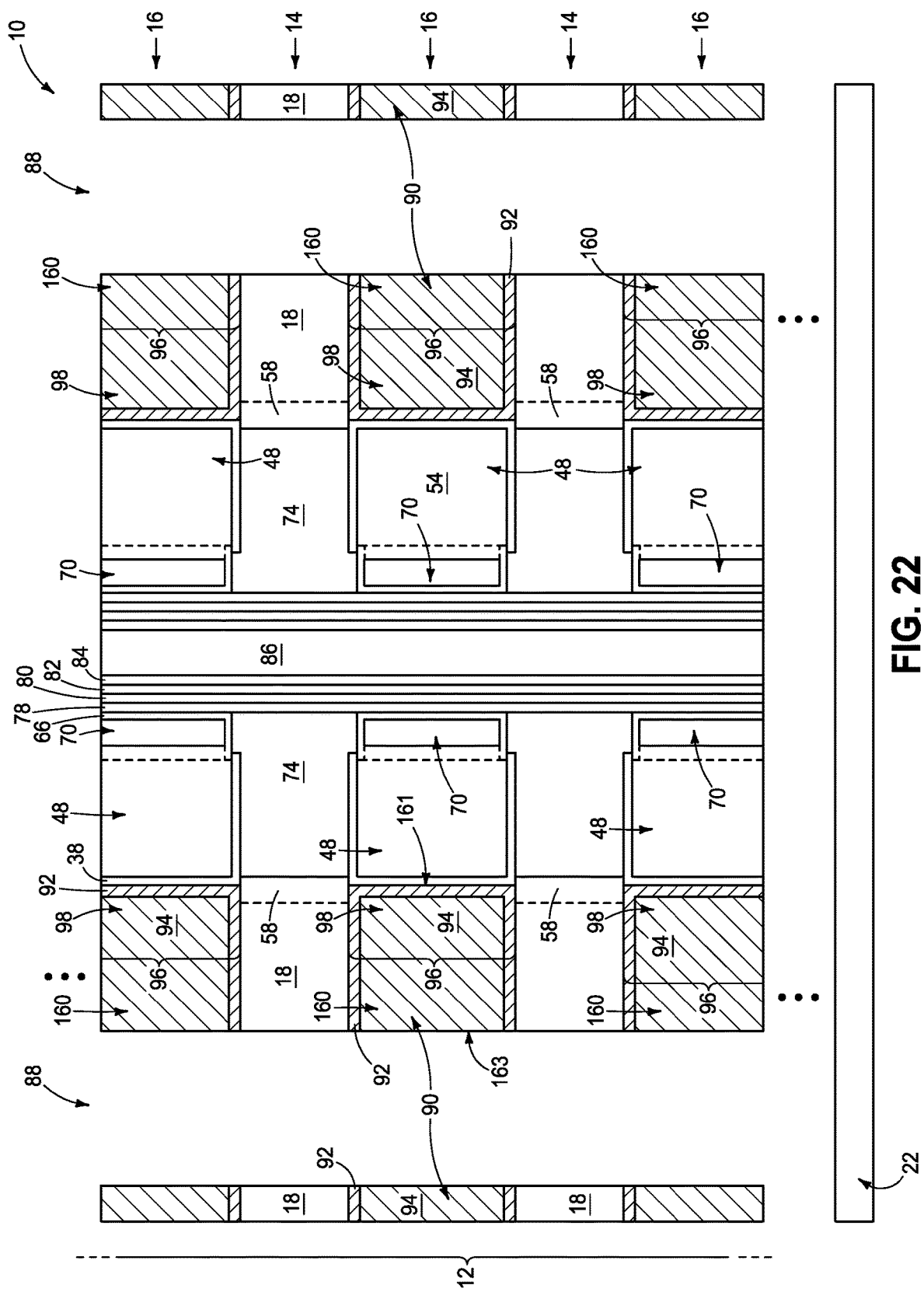

Referring to FIG. 22, conductive materials 92 and 94 are removed from within central regions of openings 88, while leaving the conductive materials 92 and 94 within the cavities 90.

The conductive materials 92 and 94 remaining within the cavities 90 together form conductive regions 96. Although the illustrated conductive regions comprise two conductive materials, in other embodiments analogous conductive regions may comprise only a single conductive material, or may comprise more than two conductive materials.

Portions of the conductive regions 96 proximate the charge-blocking regions 48 may correspond to conductive gates 98, and portions of the conductive regions 96 more distal from the charge-blocking regions 48 may correspond to wordlines 160. The wordlines are along the levels 16, and accordingly in some embodiments the levels 16 and may be referred to as wordline levels. Such wordline levels may be considered to alternate with the insulative levels 14 within the stack 12 of FIG. 22.

In some embodiments, the conductive regions 96 may be considered to comprise first ends 161 and second ends 163 in opposing relation to the first ends. The first ends 161 are comprised by the gates 98, and may be referred to as gate ends; and the second ends 163 are comprised by the wordlines 160, and may be referred to as wordline ends.

Figure 23:
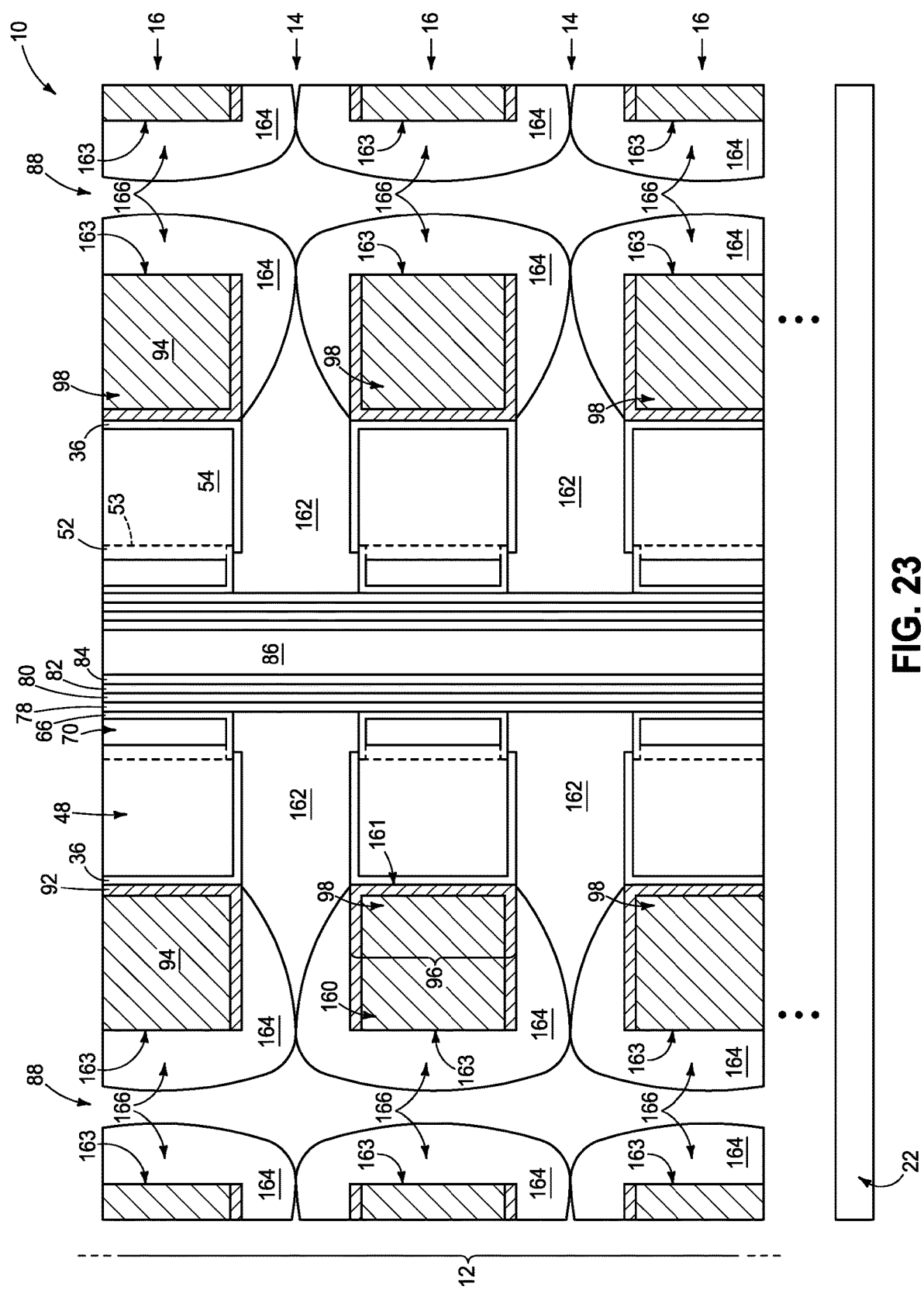

Referring to FIG. 23, the first material 18 (FIG. 22), silicon oxynitride 58 (FIG. 22), and material 74 (FIG. 22) are removed with appropriate etching to leave voids 162. In some embodiments, the materials 18 and 74 comprise, consist essentially of, or consist of silicon nitride, and the etching utilized to remove such materials comprises phosphoric acid as the primary etchant. The phosphoric acid will etch through the silicon oxynitride 58 slower than the silicon nitride materials; but can etch through the silicon oxynitride, particularly if the silicon oxynitride 58 is less than 10 Å thick. If the silicon oxynitride 58 is problematic, such may be omitted. Alternatively, the etching utilized to form the voids 162 may comprise multiple stages, with some of the stages being directed toward the removal of the silicon nitride materials 18 and 74, and another stage being directed toward the removal of the silicon oxynitride material 58.

A byproduct that may occur when utilizing phosphoric acid-based etches to remove silicon nitride is low-density silicon dioxide 164. The term "low-density silicon dioxide" as utilized herein and in the claims that follow means silicon dioxide having an etch rate of at least 200 Å/minute when utilizing hydrofluoric acid diluted 1:50 in water, at room temperature. In some embodiments, the low-density silicon dioxide may have an etch rate of at least about 300 Å/minute, at least about 500 Å/minute, or even at least about 1000 Å/minute; when utilizing hydrofluoric acid diluted 1:50 in water, at room temperature. Low-density silicon dioxide is highly porous, and accordingly has a lower dielectric constant then higher density (less porous) silicon dioxide. It can be desired to utilize low dielectric constant materials as insulative materials between vertically-adjacent wordlines in order to reduce capacitive coupling between the wordlines.

Some embodiments advantageously utilized the low-density silicon dioxide 164 to seal the voids 162, and such is diagrammatically illustrated in FIG. 23. The low-density silicon dioxide 164 produced as a byproduct of the etching of the silicon nitride wraps around the wordline ends 163 of the conductive regions 96. The low-density silicon dioxide 164 may be considered to be configured as insulative liner regions 166 which extend around the ends 163 of the conductive regions 96. In the embodiment of FIG. 23, the insulative liner regions 166 merge with one another to pinch off ends of the voids 162 (or, in other words, join with one another to seal ends of the voids).

Figure 24:
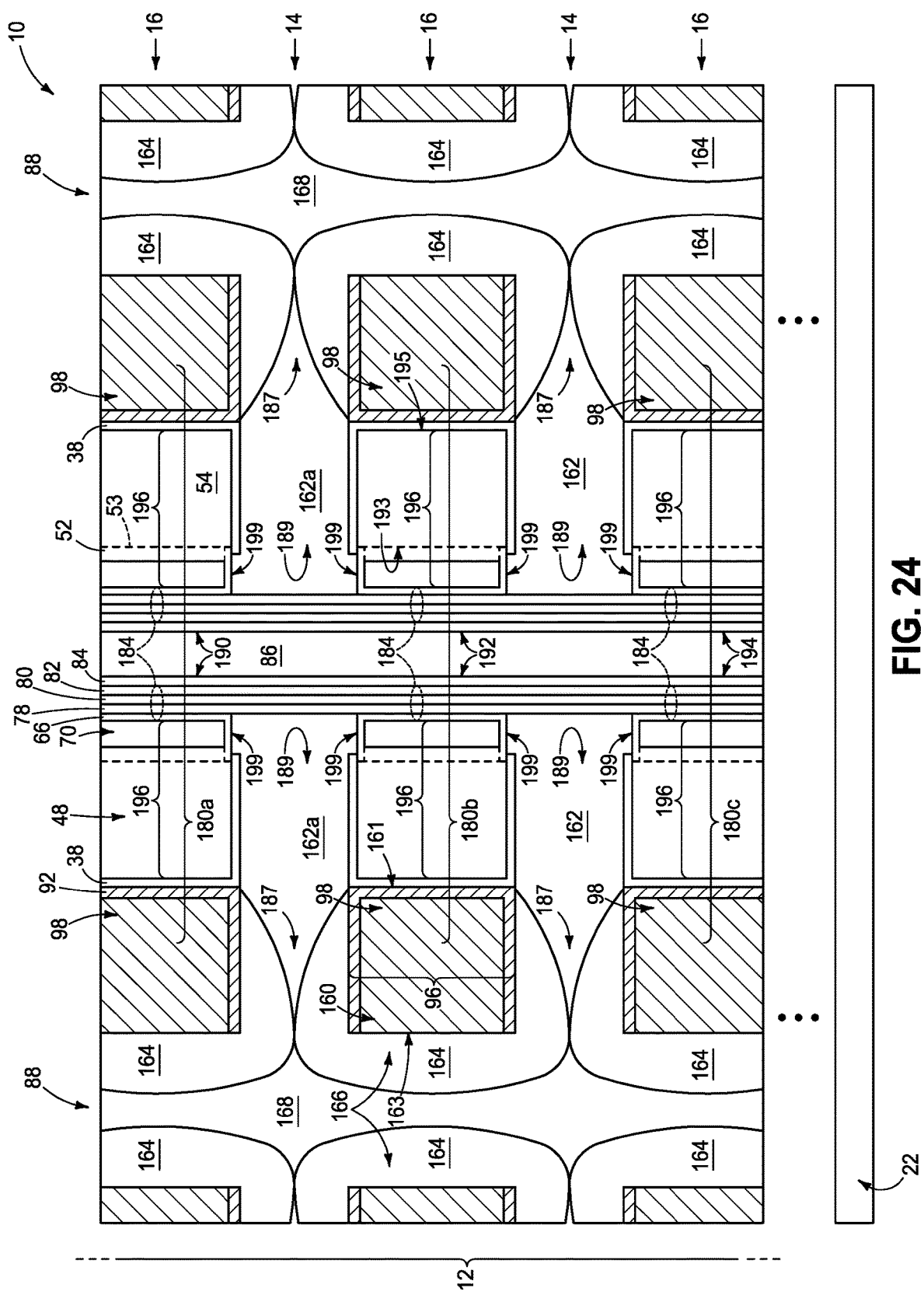

The insulative liners 166 do not entirely fill the openings 88 in the embodiment of FIG. 23. Accordingly, remaining portions of the openings 88 are filled with additional insulative material 168, as shown in FIG. 24. The insulative material 168 may comprise any suitable composition(s). In some embodiments, the insulative material 168 will comprise, consist essentially of, or consist of silicon dioxide; but will be of a higher density than the low-density silicon dioxide 164. For instance, in some embodiments the insulative material 168 may have an etch rate of less than about 100 Å/minute when utilizing hydrofluoric acid diluted 1:50 in water, at room temperature.

Figure 25:
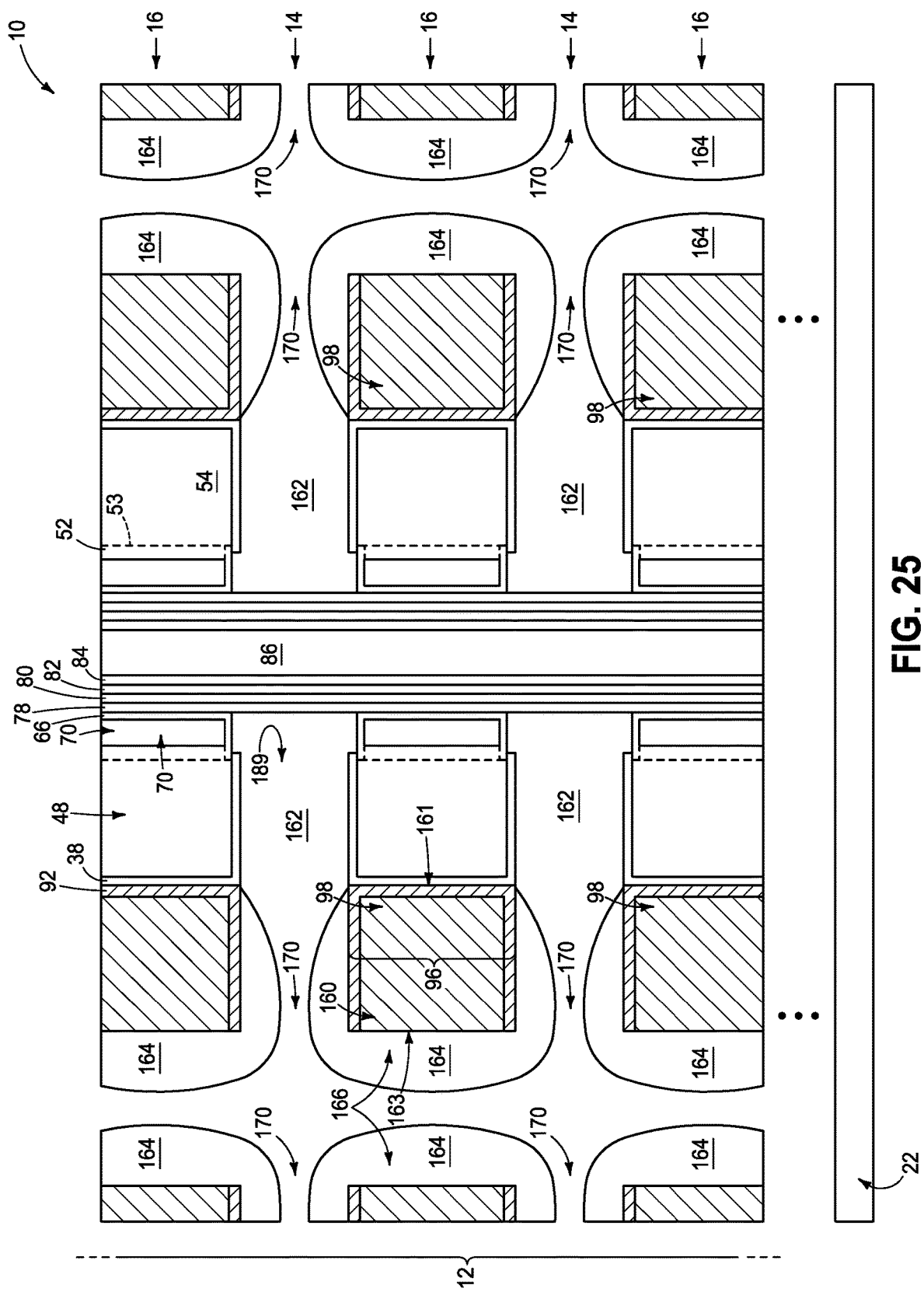
FIGS. 25 and 26 are diagrammatic cross-sectional views of regions of the construction of FIG. 22 at example process steps that may follow the example process stage of FIG. 22 in an example method different from that described with reference to FIGS. 23 and 24.

The embodiment of FIG. 23 shows low-density insulative material 164 forming insulative regions 166 which merge with one another to seal the voids 162. In other embodiments, at least some of the insulative regions may not merge with one another; and accordingly, open orifices 170 may remain at ends of the voids (i.e., may extend into the voids), as shown in FIG. 25. However, the insulative material 168 utilized to fill the openings 88 may also seal the orifices 170, as shown in FIG. 26.

Figure 26:
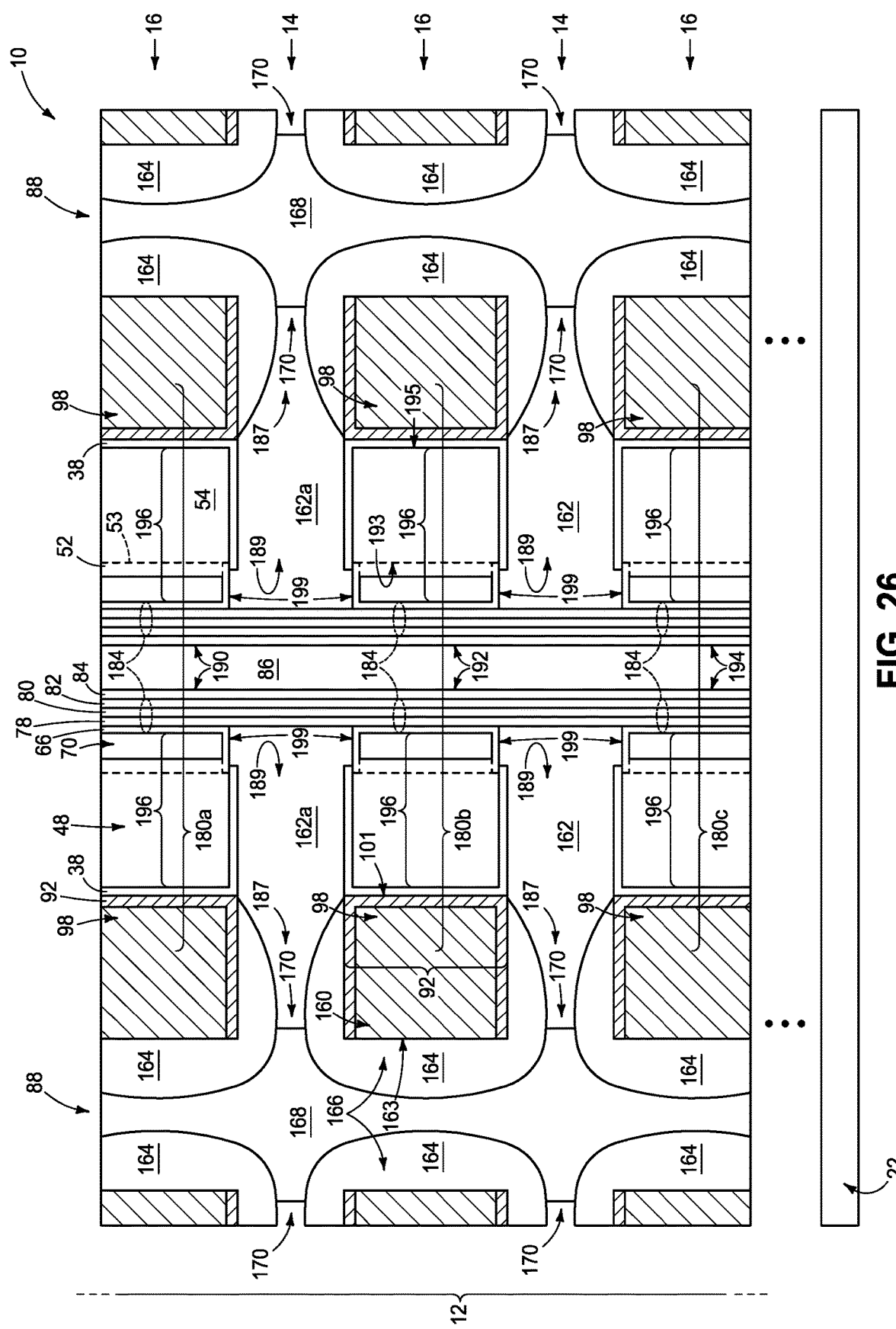

The assemblies 10 of FIGS. 24 and 26 comprise example arrangements of memory cells, and in some embodiments may correspond to example configurations of memory arrays (e.g., NAND memory arrays). Specifically, the conductive gates 98, together with the dielectric barrier material 38, charge-blocking regions 48, charge-storage regions 70, tunneling materials 66, 78, 80 and 82, and channel material 84 may be incorporated into memory cells 180a, 180b and 180c. Such memory cells may be NAND memory cells in some embodiments. The illustrated memory cells are vertically-stacked one atop another, and may be part of a NAND string. The memory cells 180a, 180b and 180c are substantially identical to one another (with the term "substantially identical" meaning identical to within reasonable tolerances of fabrication and measurement), and in some embodiments may be referred to as a first memory cell, a second memory cell and a third memory cell, respectively. The memory cells 180a, 180b and 180c may be considered to be representative of a large number of substantially identical memory cells which may be fabricated across a memory array; such as, for example, a NAND memory array analogous to those described above with reference to FIGS. 1-4.

In operation, the charge-storage regions 70 may be configured to store information in the memory cells 180a, 180b and 180c. The value (with the term "value" representing one bit or multiple bits) of information stored in an individual memory cell (e.g., 180*a*) may be based on the amount of charge (e.g., the number of electrons) stored in a charge-storage region. The amount of charge within an individual charge-storage region 70 may be controlled (e.g., increased or decreased), at least in part, based on the value of voltage applied to an associated gate 98, and/or based on the value of voltage applied to an associated channel material 84.

The tunneling materials 66, 78, 80 and 82 together form tunneling regions 184 of the memory cells 180*a*, 180*b* and 180*c*. Such tunneling regions may be configured to allow desired tunneling (e.g., transportation) of charge (e.g., electrons) between the charge-storage regions 70 and the channel material 84. The tunneling regions 184 may be configured (i.e., engineered) to achieve a selected criterion, such as, for example, but not limited to, an equivalent oxide thickness (EOT). The EOT quantifies the electrical properties of the tunneling region (e.g., capacitance) in terms of a representative physical thickness. For example, EOT may be defined as the thickness of a theoretical silicon dioxide layer that would be required to have the same capacitance density as a given dielectric (e.g., tunneling region 184), ignoring leakage current and reliability considerations.

The charge-blocking regions 48 are adjacent to the charge-storage regions 70, and may provide a mechanism to block charge from flowing from the charge-storage regions 70 to the associated gates 98. The dielectric barrier material 38 is provided between the charge-blocking regions 48 and the associated gates 98, and may be utilized to inhibit back-tunneling of electrons from the gates 98 toward the charge-storage regions 70. In some embodiments, the dielectric barrier material 38 may be considered to form dielectric barrier regions within the memory cells 180*a*, 180*b* and 180*c*.

In some embodiments, the channel material 84 may be considered to be a channel configured to conduct current. The channel includes a first channel portion 190 which is incorporated into the first memory cell 180*a*, a second channel portion 192 which is incorporated into the second memory cell 180*b*, and a third channel portion 194 which is incorporated into the third memory cell 180*c*.

The gate 98 which is incorporated into the memory cell 180*a* may be referred to as a first gate, the gate 98 which is incorporated into the second memory cell 180*b* may be referred to as a second gate, and the gate 98 which is incorporated into the third memory cell 180*c* may be referred to as a third gate.

The charge-blocking region 48 and charge-storage region 70 within a memory cell may be together considered to be a memory cell structure 196. The memory cell structure 196 within the first memory cell 180*a* may be referred to as a first memory cell structure, the memory cell structure 196 within the second memory cell 180*b* may be referred to as a second memory cell structure, and the memory cell structure 196 within the third memory cell 180*c* may be referred to as a third memory cell structure. The dielectric barrier material 38 forms dielectric barrier regions within the first, second and third memory cells 180*a*, 180*b* and 180*c*. Such dielectric barrier regions may be considered to be part of the memory cell structures 196 in some embodiments, and may be considered to be separate from the memory cell structures 196 in other embodiments. The dielectric barrier region within the first memory cell 180*a* may be referred to as a first dielectric barrier region, the dielectric barrier region within the second memory cell 180*b* may be referred to as a second dielectric barrier region, and the dielectric barrier region within the third memory cell 180*c* may be referred to as a third dielectric barrier region.

The charge-blocking regions 48 within the memory cell structures 196 are between the charge-storage regions 70 and the gates 98. In the illustrated embodiments of FIGS. 24 and 26, the silicon oxynitride 54 within the charge-blocking regions 48 may be considered to have two opposing lateral sides 193 and 195. The silicon dioxide 52 of the charge-blocking regions 48 is along one of the opposing lateral sides (the side 193), and the other of the opposing lateral sides (the side 195) is directly adjacent the dielectric barrier material 38 in the shown embodiment.

The gate 98 of the first memory cell 180*a* is vertically spaced from the gate 98 of the second memory cell 180*b*. One of the voids 162 is vertically between the vertically-spaced gates 98 of the first and second memory cells 180*a* and 180*b*; and such void is labeled as 162*a* in FIGS. 24 and 26 to enable the void to be distinguished from the other voids.

The void 162*a* has a region 187 between the vertically-neighboring gates of the memory cells 180*a* and 180*b*, and has another region 189 between the vertically-neighboring memory cell structures 196 of the memory cells 180*a* and 180*b*. The other voids 162 have similar regions 187 and 189. Accordingly, the voids 162 can provide electrical isolation between vertically-neighboring memory cell structures 196, and can also provide electrical isolation between vertically-neighboring conductive gates 98. In the shown embodiment of FIGS. 24 and 26, at least portions of the conductive regions 96 of the gates 98 are spaced from the voids 162 by low-density silicon dioxide 164, and the charge-storage regions 70 are spaced from the voids by liners 199 corresponding to regions of the silicon oxynitride 66. The dielectric barrier materials 38 are directly against the voids 162.

In some embodiments, the stacks 12 of FIGS. 24 and 26 may be considered to comprise alternating insulative levels 14 and wordline levels 16. The channel material 84 extends vertically along the stack 12, and the gates 98 are along the wordline levels and spaced from the channel material by the tunneling materials (66, 76, 80 and 82), the memory cell structures 196, and the dielectric barrier material 38.

The charge-storage regions (i.e., charge-storage structures) 70 are vertically-spaced from one another by intervening regions of the voids 162 along the insulative levels 14. The vertical separation of the charge-storage regions 70 from one another may alleviate or prevent charge leakage between neighboring charge-storage regions within a common NAND string; and may mitigate coupling of charge-storage regions with other components (e.g., neighboring charge-storage regions, control gate, channel, tunnel oxide, etc.). Such may enable substantial improvements relative to conventional NAND configurations having a continuous charge-storage structure extending along all of the memory cells of a NAND string. Example improvements may include one or more of improved endurance, improvement in read/write budget, improvement in quick charge gain, improvement in quick charge loss, reduced cell-to-cell capacitive coupling, cycling, etc.

Isolation of vertically-adjacent charge-storage regions from one another (as compared to conventional configurations having continuous charge-storage regions) may alleviate or prevent charge leakage and charge coupling between neighboring charge-storage regions, and other neighboring components within a common NAND string.

Provision of voids (e.g., air gaps) between vertically-adjacent wordlines may reduce capacitive capacitance between the wordlines, and may improve resistor-capacitor (RC) properties of the wordlines. Such may reduce programming delay and/or provide other advantages as compared to other configurations.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory array which has a vertical stack of alternating insulative levels and wordline levels. Channel material extends vertically along the stack. Conductive segments are along the wordline levels. Individual of the conductive segments have, along a cross-section, first and second ends in opposing relation to one another. The conductive segments include gates and wordlines adjacent the gates. The wordlines encompass the second ends and the gates encompass the first ends. Memory cell structures are along the wordline levels and are located between the gates and the channel material. The memory cell structures include charge-storage regions and charge-blocking regions. The charge-blocking regions are between the charge-storage regions and the gates. Voids are along the insulative levels and are between vertically-neighboring of the memory cell structures. Insulative liner regions are along the wordline levels and extend around the second ends of the conductive segments. The insulative liner regions contain low density silicon dioxide.

Some embodiments include an assembly having a channel to conduct current. The channel includes a first channel portion and a second channel portion under the first channel portion. A first memory cell structure is located between a first gate and the first channel portion. The first memory cell structure includes a first charge-storage region and a first charge-blocking region. The first charge-blocking region is located between the first charge-storage region and the first gate. The first charge-blocking region comprises silicon oxynitride, and the first charge-storage region comprises silicon nitride. A second memory cell structure is under the first memory cell structure and is located between a second gate and the second channel portion. The second memory cell structure includes a second charge-storage region and a second charge-blocking region. The second charge-blocking region is located between the second charge-storage region and the second gate. The second charge-blocking region comprises silicon oxynitride, and the second charge-storage region comprises silicon nitride. A void is located between the first and second gates, and between the first and second memory cell structures. The first gate comprises conductive material over the void and spaced from the void by low-density silicon dioxide. The second gate comprises conductive material under the void and spaced from the void by low-density silicon dioxide. A first liner is between the silicon nitride of the first charge-storage region and the void. A second liner is between the silicon nitride of the first charge-storage region and the void.

Some embodiments include a method of forming an assembly. A first opening is formed through a stack of alternating first and second levels. The first levels contain silicon nitride, and the second levels contain silicon dioxide. Some of the silicon dioxide of the second levels is replaced with memory cell structures while leaving remaining portions of the silicon dioxide of the second levels. The memory cell structures include charge-storage regions adjacent charge-blocking regions. Vertically-extending tunneling material is formed within the first opening. The tunneling material extends along the charge-storage regions of the memory cell structures. Channel material is formed within the first opening and adjacent the tunneling material. A second opening is formed through the stack. The second opening extends through the remaining portions of the silicon dioxide of the second levels, and extends through the silicon nitride of the first levels. The remaining portions of the silicon dioxide of the second levels are removed to form cavities along the second opening. Conductive regions are formed within the cavities. The silicon nitride of the first levels is removed to form voids between the conductive regions.

Some embodiments include a method of forming an assembly. A first opening is formed through a stack of alternating first and second levels. The first levels comprise first material, and the second levels comprise second material. The first material of the first levels is recessed along the first opening to form first gaps. The first gaps are vertically between segments of the second levels. Spacing structures are formed within the first gaps. The second material of the second levels is recessed along the first opening to form second gaps and to leave remaining portions of the second material along the second gaps. The second gaps are vertically between segments of the spacing structures. Individual of the second gaps each have an upper peripheral surface, a lower peripheral surface and an inner peripheral surface. Liners of dielectric barrier material are formed to extend along the upper peripheral surface, the inner peripheral surface and the lower peripheral surface of each of the second gaps, and to narrow the second gaps. First silicon nitride segments are formed within the narrowed second gaps and along the second levels. Vertically-neighboring of the first silicon nitride segments are vertically-spaced from one another by intervening regions which include the spacing structures. Oxidizing conditions are utilized to oxidize the silicon nitride segments and to oxidize the spacing structures. The oxidized silicon nitride segments are charge-blocking regions. The oxidized spacing structures are ledges. Third gaps are vertically between the ledges. Second silicon nitride segments are formed within the third gaps and along the charge-blocking regions. Edges of the second silicon nitride segments are oxidized. The oxidized edges include edges along the first opening, and include edges along the ledges. Remaining regions of the silicon nitride segments which are not oxidized are charge-trapping regions. The ledges are removed to leave fourth gaps. The fourth gaps are vertically between the charge-trapping regions. Third silicon nitride segments are formed within the fourth gaps. The third silicon nitride segments are along the first levels and are adjacent remaining portions of the first material. Vertically-extending tunneling material is formed within the first opening. The tunneling material extends along edges of the third silicon nitride segments and along the charge-trapping regions. Channel material is formed within the first opening and adjacent the tunneling material. A second opening is formed through the stack. The second opening extends through the remaining portions of the first material, and through the remaining portions of the second material. The remaining portions of the second material of the second levels are removed to form cavities along the second levels. Conductive regions are formed within the cavities. The remaining portions of the first material and the third silicon nitride segments of the first levels are removed to form voids along the second opening.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an assembly, comprising:
    forming a first opening through a stack of alternating first and second levels; the first levels comprising silicon nitride, and the second levels comprising silicon dioxide;
    replacing some of the silicon dioxide of the second levels with memory cell structures while leaving remaining portions of the silicon dioxide of the second levels; the memory cell structures comprising charge-storage regions adjacent charge-blocking regions;
    forming vertically-extending tunneling material within the first opening, the tunneling material extending along the charge-storage regions of the memory cell structures;
    forming channel material within the first opening and adjacent the tunneling material;
    forming a second opening through the stack; the second opening extending through the remaining portions of the silicon dioxide of the second levels, and through the silicon nitride of the first levels;
    removing the remaining portions of the silicon dioxide of the second levels to form cavities along the second opening;
    forming conductive regions within the cavities; and
    removing the silicon nitride of the first levels to form voids between the conductive regions; wherein the silicon nitride of the first levels is first silicon nitride, and further comprising replacing some of the first silicon nitride of the first levels with second silicon nitride after forming the first opening and prior to forming the second opening; wherein the removing of the silicon nitride to form the voids comprises removing the first and second silicon nitride; and wherein the voids have regions between vertically-neighboring of the gates and have regions between vertically-neighboring of the memory cell structures.

2. The method of claim 1 wherein the removing of the first and second silicon nitride forms insulative liner regions extending around the ends of the conductive regions adjacent the second opening; the insulative liner regions comprising low density silicon dioxide.

3. The method of claim 2 wherein vertically-neighboring of the insulative liner regions join with one another to seal ends of the voids.

4. The method of claim 3 wherein the insulative liner regions partially fill the second opening; and further comprising filling a remainder of the second opening with silicon dioxide having a higher density than the silicon dioxide of the insulative liner regions.

5. The method of claim 2 wherein vertically-neighboring of the insulative liner regions are vertically-spaced from one another along ends of the voids to leave orifices extending into the ends of the voids; wherein the insulative liner regions partially fill the second opening; and further comprising filling the orifices and a remainder of the second opening with silicon dioxide having a higher density than the silicon dioxide of the insulative liner regions.

6. A method of forming an assembly, comprising:
    forming a first opening through a stack of alternating first and second levels; the first levels comprising first material, and the second levels comprising second material;
    recessing the first material of the first levels along the first opening to form first gaps; the first gaps being vertically between segments of the second levels;
    forming spacing structures within the first gaps;
    recessing the second material of the second levels along the first opening to form second gaps and to leave remaining portions of the second material along the second gaps; the second gaps being vertically between segments of the spacing structures; individual of the second gaps each having an upper peripheral surface, a lower peripheral surface and an inner peripheral surface;
    forming liners of dielectric barrier material to extend along the upper peripheral surface, the inner peripheral surface and the lower peripheral surface of each of the second gaps, and to narrow the second gaps;
    forming first silicon nitride segments within the narrowed second gaps and along the second levels; vertically-neighboring of the first silicon nitride segments being vertically-spaced from one another by intervening regions which include the spacing structures;

utilizing oxidizing conditions to oxidize the silicon nitride segments and to oxidize the spacing structures; the oxidized silicon nitride segments being charge-blocking regions; the oxidized spacing structures being ledges; third gaps being vertically between the ledges;

forming second silicon nitride segments within the third gaps and along the charge-blocking regions;

oxidizing edges of the second silicon nitride segments; the oxidized edges including edges along the first opening, and including edges along the ledges; remaining regions of the silicon nitride segments which are not oxidized being charge-trapping regions;

removing the ledges to leave fourth gaps; the fourth gaps being vertically between the charge-trapping regions;

forming third silicon nitride segments within the fourth gaps; the third silicon nitride segments being along the first levels and being adjacent remaining portions of the first material;

forming vertically-extending tunneling material within the first opening; the tunneling material extending along edges of the third silicon nitride segments and along the charge-trapping regions;

forming channel material within the first opening and adjacent the tunneling material;

forming a second opening through the stack; the second opening extending through the remaining portions of the first material, and through the remaining portions of the second material;

removing the remaining portions of the second material of the second levels to form cavities along the second levels;

forming conductive regions within the cavities; and removing the remaining portions of the first material and the third silicon nitride segments of the first levels to form voids along the second opening.

7. The method of claim 6 wherein the removing of the remaining portions of the first material and the third silicon nitride segments of the first levels forms insulative liner regions extending around the ends of the conductive regions adjacent the second opening; the insulative liner regions comprising low density silicon dioxide.

8. The method of claim 7 wherein vertically-neighboring of the insulative liner regions join with one another to seal ends of the voids.

9. The method of claim 8 wherein the insulative liner regions partially fill the second opening; and further comprising filling a remainder of the second opening with silicon dioxide having a higher density than the silicon dioxide of the insulative liner regions.

10. The method of claim 7 wherein vertically-neighboring of the insulative liner regions are vertically-spaced from one another along ends of the voids to leave orifices extending into the ends of the voids; wherein the insulative liner regions partially fill the second opening; and further comprising filling the orifices and a remainder of the second opening with silicon dioxide having a higher density than the silicon dioxide of the insulative liner regions.

11. The method of claim 6 wherein the forming of the liners of dielectric barrier material comprises:

forming a layer of the dielectric barrier material to extend conformally along the peripheral surfaces of the second gaps and along outer edges of the spacing structures;

forming a mass of silicon nitride along the layer of the dielectric barrier material; the mass of silicon nitride extending within the gaps and along the outer edges of the spacing structures;

removing some of the mass of silicon nitride to form the first silicon nitride segments from the mass of silicon nitride; and after removing said some of the mass of silicon nitride; removing the dielectric material from along the edges of the spacing structures while leaving the liners of the dielectric barrier material.

12. The method of claim 6 wherein the first material comprises silicon nitride; and wherein the second material comprises silicon dioxide.

13. The method of claim 12 wherein the second levels are vertically thicker than the first levels.

14. The method of claim 6 wherein the recessing of the second material to form the second gaps exposes regions of the first material along back portions of the second gaps.

15. The method of claim 6 wherein the spacing structures comprise polycrystalline silicon; and wherein the oxidizing conditions induce more expansion along the polycrystalline silicon than along the silicon nitride of the silicon nitride segments.

16. The method of claim 15 wherein the oxidizing conditions induce at least about double the expansion along the polycrystalline silicon than along the silicon nitride.

17. The method of claim 15 wherein the oxidizing conditions induce substantially no expansion along the silicon nitride.

18. The method of claim 6 wherein the spacing structures comprise polycrystalline silicon; and wherein the oxidizing conditions oxidize the polycrystalline silicon faster than the silicon nitride segments.

19. The method of claim 18 wherein the first material comprises silicon nitride; wherein the ledges have front edges along the first opening, and have back edges along the first material; wherein the oxidizing conditions oxidize the regions of the first material along the back edges of the ledges to form silicon oxynitride liners; wherein the third silicon nitride segments are formed directly against the silicon oxynitride liners; and wherein the formation of the voids includes removal of the silicon oxynitride liners.

20. The method of claim 18 wherein the oxidizing conditions utilize a temperature of at least about 700° C.

21. The method of claim 20 wherein the oxidizing conditions utilize remote plasma.

22. The method of claim 20 wherein the oxidizing conditions utilize steam.

23. The method of claim 18 wherein the charge-blocking regions comprise silicon oxynitride and silicon dioxide.

* * * * *